US006319322B1

(12) United States Patent
Ueda et al.

(10) Patent No.: US 6,319,322 B1
(45) Date of Patent: Nov. 20, 2001

(54) SUBSTRATE PROCESSING APPARATUS

(75) Inventors: Issei Ueda; Michiaki Matsushita; Kazuhiko Ito, all of Kumamoto-Ken; Tadayuki Yamaguchi, Kanagawa-Ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/353,023

(22) Filed: Jul. 13, 1999

(30) Foreign Application Priority Data

Jul. 13, 1998 (JP) .................................................. 10-197627
Oct. 13, 1998 (JP) .................................................. 10-306302

(51) Int. Cl.[7] ..................................................... B05C 11/08
(52) U.S. Cl. ........................ 118/666; 118/667; 118/712; 118/58; 118/319; 118/320
(58) Field of Search .............................. 118/66, 666, 667, 118/712, 58, 319, 320, 500, 724; 414/222.01, 935, 938, 939; 156/345

(56) References Cited

U.S. PATENT DOCUMENTS

| | | | |
|---|---|---|---|
| 5,151,871 | * | 9/1992 | Matsumura et al. . |
| 5,707,500 | * | 1/1998 | Shimanura et al. .................. 118/666 |
| 5,779,799 | * | 7/1998 | Davis .................................... 118/667 |
| 6,183,562 | * | 2/2001 | Pierce et al. ......................... 118/666 |

* cited by examiner

Primary Examiner—Laura Edwards
(74) Attorney, Agent, or Firm—Rader, Fishman & Grauer, PLLC

(57) ABSTRACT

Temperature regulation is performed at a buffer cassette in which a wafer is temporarily housed before and after being delivered to/from an aligner, or at an inlet-side delivery stage of a portion for delivering a wafer to the aligner, in reference with a state of temperature regulation of the wafer in the aligner, so that the temperature of the wafer can be more accurately regulated on a temperature regulating plate in the aligner in a shorter time. Therefore, circuit patterns can be accurately transferred, and throughput can be improved by speeding up the processing.

20 Claims, 19 Drawing Sheets

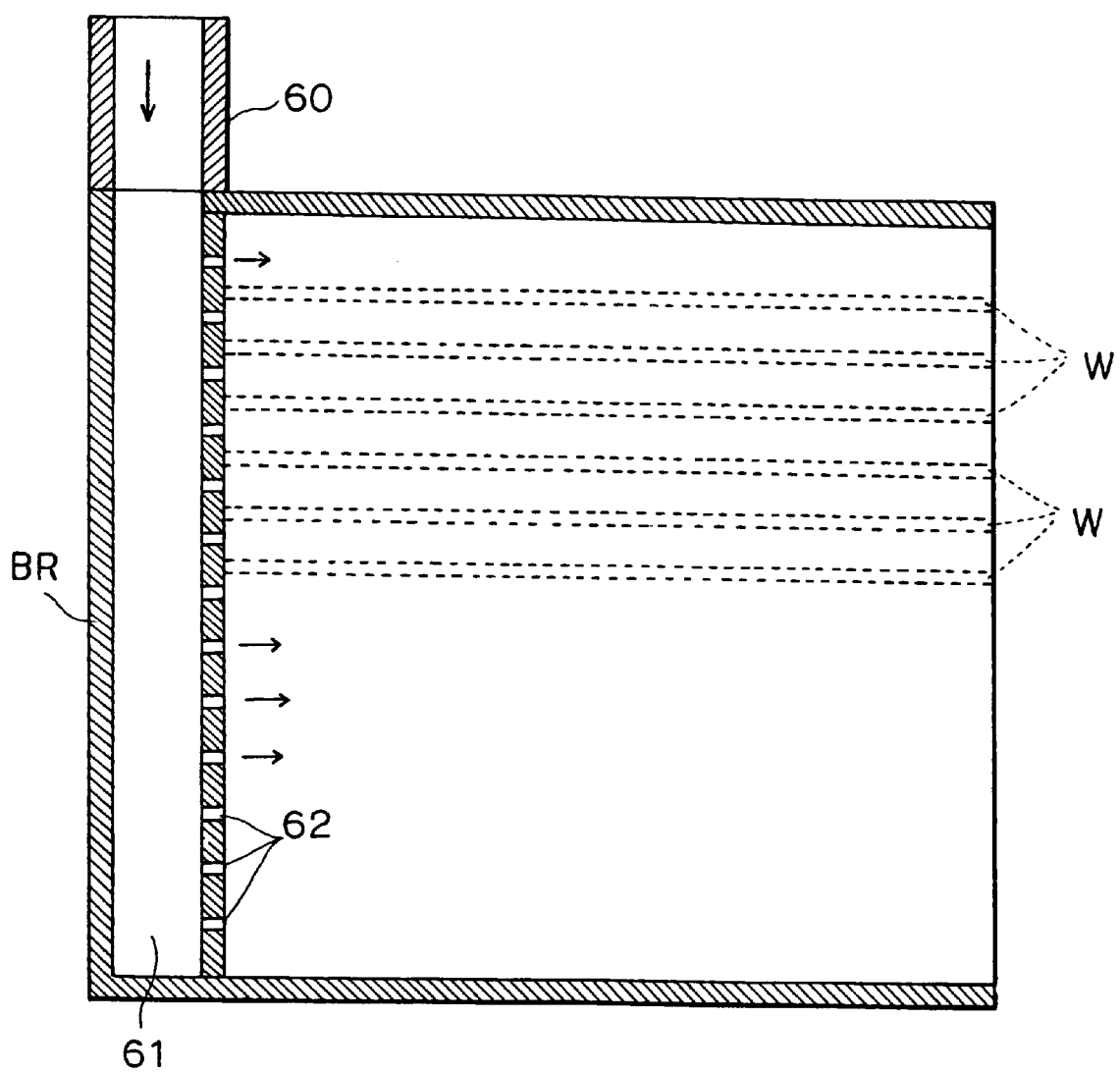
F I G. 4

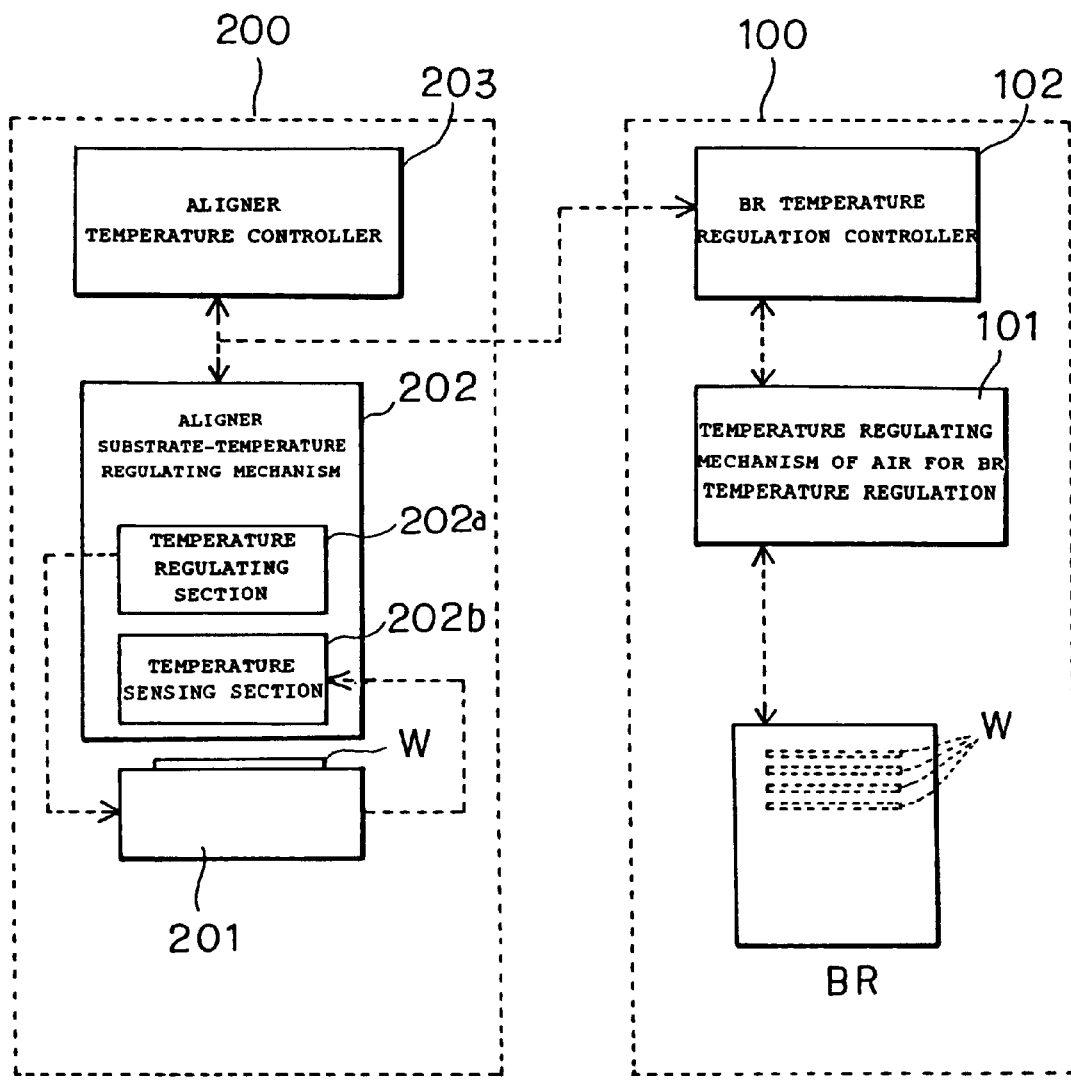
F I G. 5

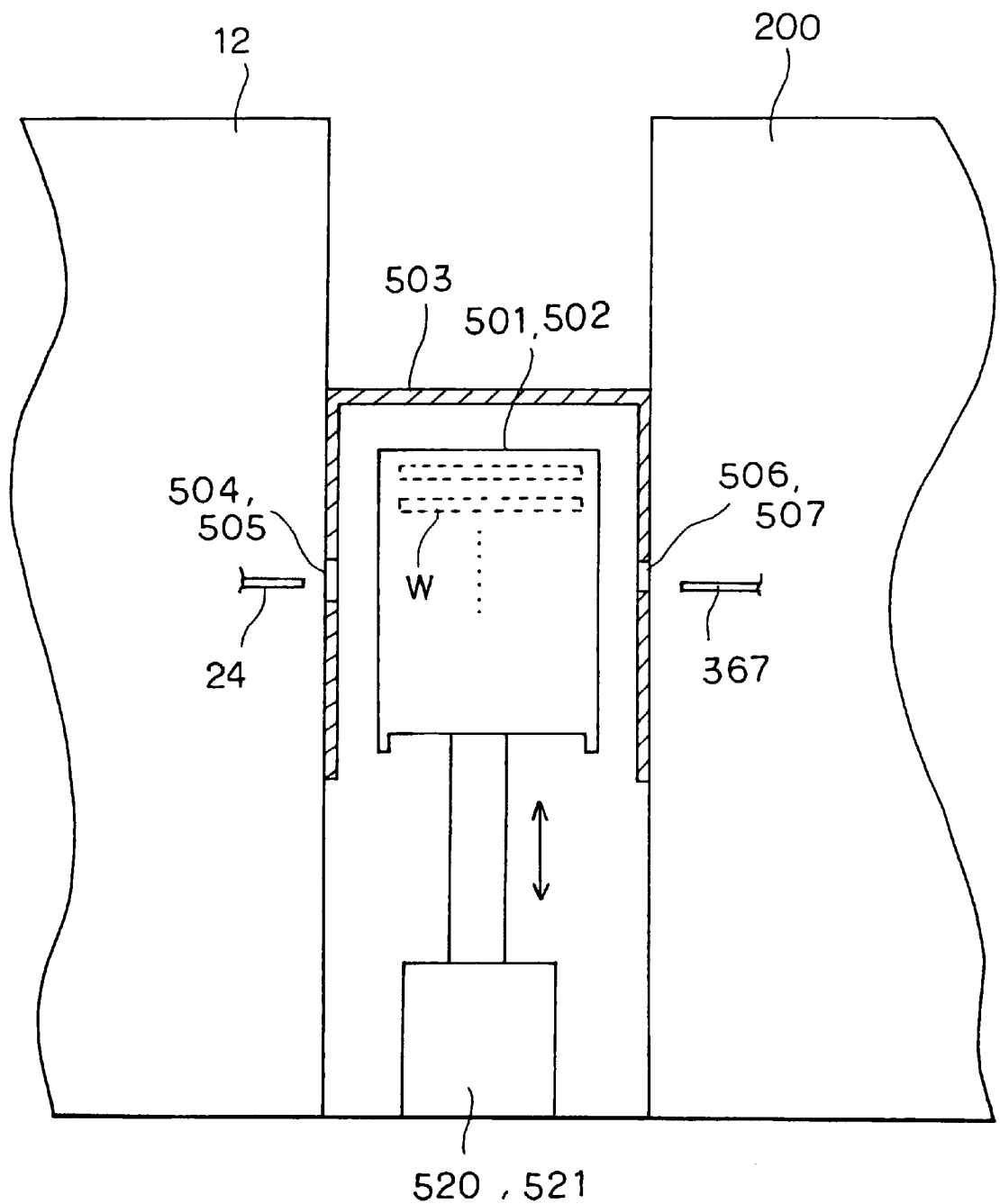
F I G. 14

SUBSTRATE PROCESSING APPARATUS

BACKGROUND OF THE INVENTION

1. Field of the Invention

The present invention relates to a substrate processing apparatus for coating, for example, a semiconductor wafer, or an LCD substrate with a resist, and developing it.

2. Description of the Related Art

Conventionally, for example, in a process of photolithography in the fabricating process of a semiconductor device, a resist coating processing for forming a resist coating film on the surface of a semiconductor wafer, and a developing processing for performing development to the wafer after performing exposure to the semiconductor coated with a resist, are carried out. The resist coating and developing are conventionally carried out in accordance with a predetermined sequence adding an exposing process in between in a complex processing system in which various corresponding processing units are installed in one system, for example, as known from Japanese Patent Publication No. Hei 2-30194.

In the semiconductor device, the circuit pattern thereof is recently fined and intended to highly integrate. Therefore, for example, when a predetermined pattern is exposed to the semiconductor wafer by, for example, an aligner such as a stepper, precise positioning is performed to transfer a fine circuit pattern accurately, and precise temperature regulation and the like are performed to prevent displacement due to thermal expansion and heat shrinkage caused by a slight temperature discrepancy.

SUMMARY OF THE INVENTION

As described above, in a process of photolithography for transferring a circuit pattern of a semiconductor device and the like, precise temperature regulation of the semiconductor and the like is performed in an aligner.

However, in the semiconductor device and the like, a further integration is intended and the circuit pattern is made to be finer. Therefore, it is naturally required to intend further precise temperature regulation and improvement in throughput by speeding up processing also in the process of photolithography.

An object of the present invention is to provide a substrate processing apparatus in which further precise temperature regulation and an accurate transfer of a circuit pattern as compared with a conventional one can be performed, and improvement in throughput by speeding up the processing can be intended.

To achieve the above object, the first aspect of the present invention comprises: an aligner for exposing a substrate coated with a resist, while regulating the temperature of the substrate; a coating section for applying a resist to the substrate; a developing section for developing the substrate after exposure; an interface section disposed between the coating section and the developing section, and the aligner, for delivering the substrate between the substrate processing apparatus and the aligner; a transfer means for transferring the substrate between the coating section, the developing section and the interface section; a holding section disposed in the interface section for holding the substrate; and a temperature regulating means for regulating the temperature of the substrate held by the holding section in accordance with the temperature regulation in the aligner.

In the present invention, the temperature regulating means for regulating the temperature of the substrate held by the holding section in accordance with the temperature regulation in the aligner, is provided in the interface section, so that the substrate can be delivered to the aligner in a state where the temperature of the substrate is regulated closer to the temperature required in the aligner in the interface section. Accordingly, the temperature of the substrate can be more accurately regulated in the aligner in a shorter time, so that circuit patterns can be accurately transferred, and throughput can be improved by speeding up the processing.

The second aspect of the present invention comprises: an aligner for exposing a substrate coated with a resist, while regulating the temperature of the substrate; a coating section for applying a resist to the substrate; a developing section for developing the substrate after exposure; an interface section disposed between the coating section and the developing section, and the aligner, for delivering the substrate between the substrate processing apparatus and the aligner; a transfer means for transferring the substrate between the coating section, the developing section and the interface section; a first holding section disposed in the interface section, for holding the substrate before being exposed; a second holding section disposed in the interface section, for holding the substrate after being exposed; a gas supply section for supplying the temperature regulated gas to the first and second holding sections; and a temperature regulating section laid between the first holding section and the gas supply section, for further regulating the temperature of the gas supplied from the gas supply section.

In the present invention, the temperature of the gas, which is supplied from the gas supply section to the first holding section for holding the substrate before being exposed, is further regulated to supply, so that the substrate can be delivered to the aligner in a state where the temperature of the substrate is regulated closer to the temperature required in the aligner, in the interface section. Accordingly, the temperature of the substrate can be more accurately regulated in the aligner in a shorter time, so that circuit patterns can be accurately transferred, and throughput can be improved by speeding up the processing.

These objects and still other objects and advantages of the present invention will become apparent upon reading the following specification when taken in conjunction with the accompanying drawings.

BRIEF DESCRIPTION OF THE DRAWINGS

FIG. 4 is a sectional view of the buffer cassette shown in FIG. 1;

FIG. 5 is an explanatory view of a temperature regulating means according to an embodiment of the present invention;

FIG. 14 is a side view of a stage according to a modification of the embodiment shown in FIG. 12 and FIG. 13;

DESCRIPTION OF PREFERRED EMBODIMENT

Figure 1:
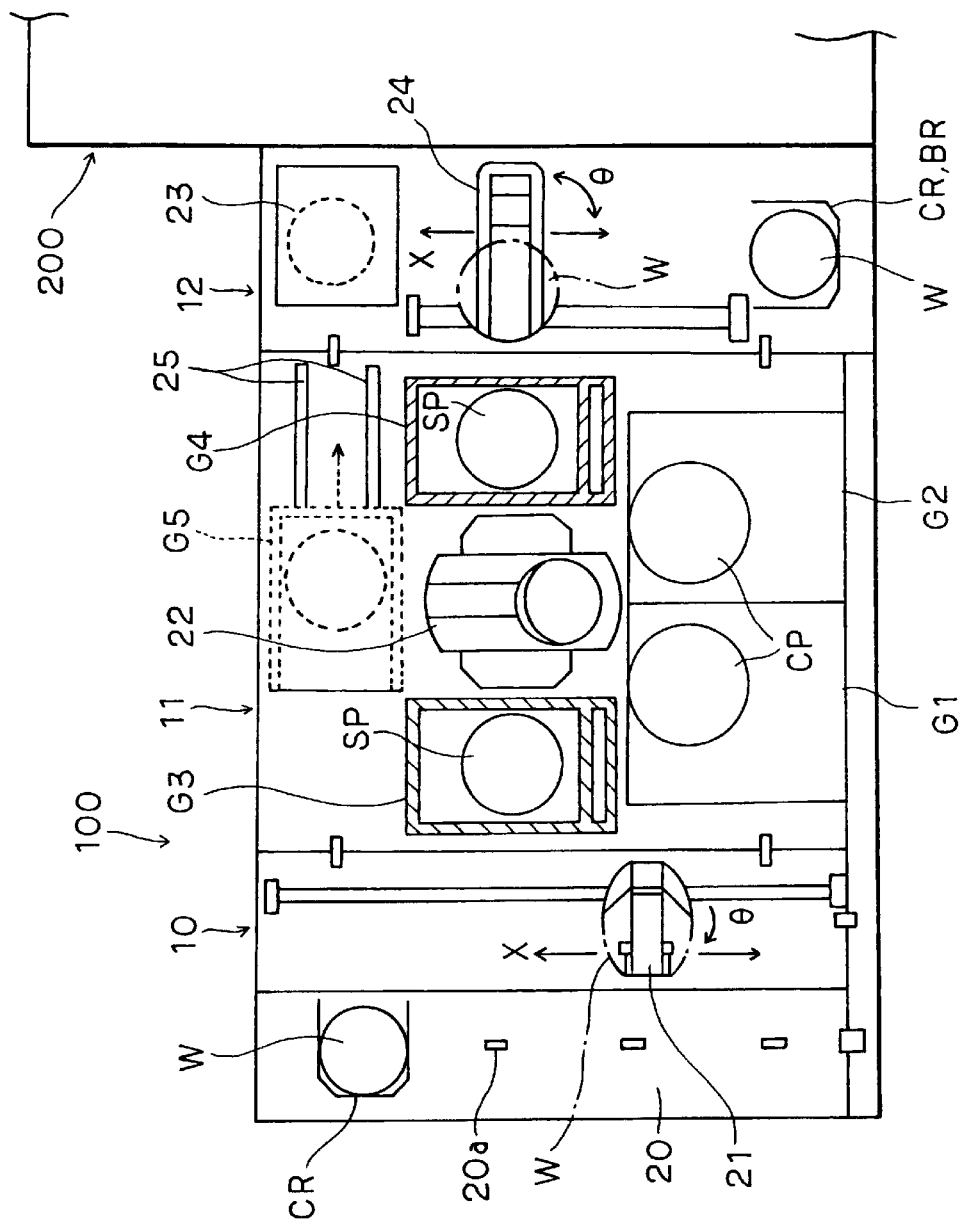
FIG. 1 is a plan view of a coating and developing system according to an embodiment of the present invention.
Figure 2:
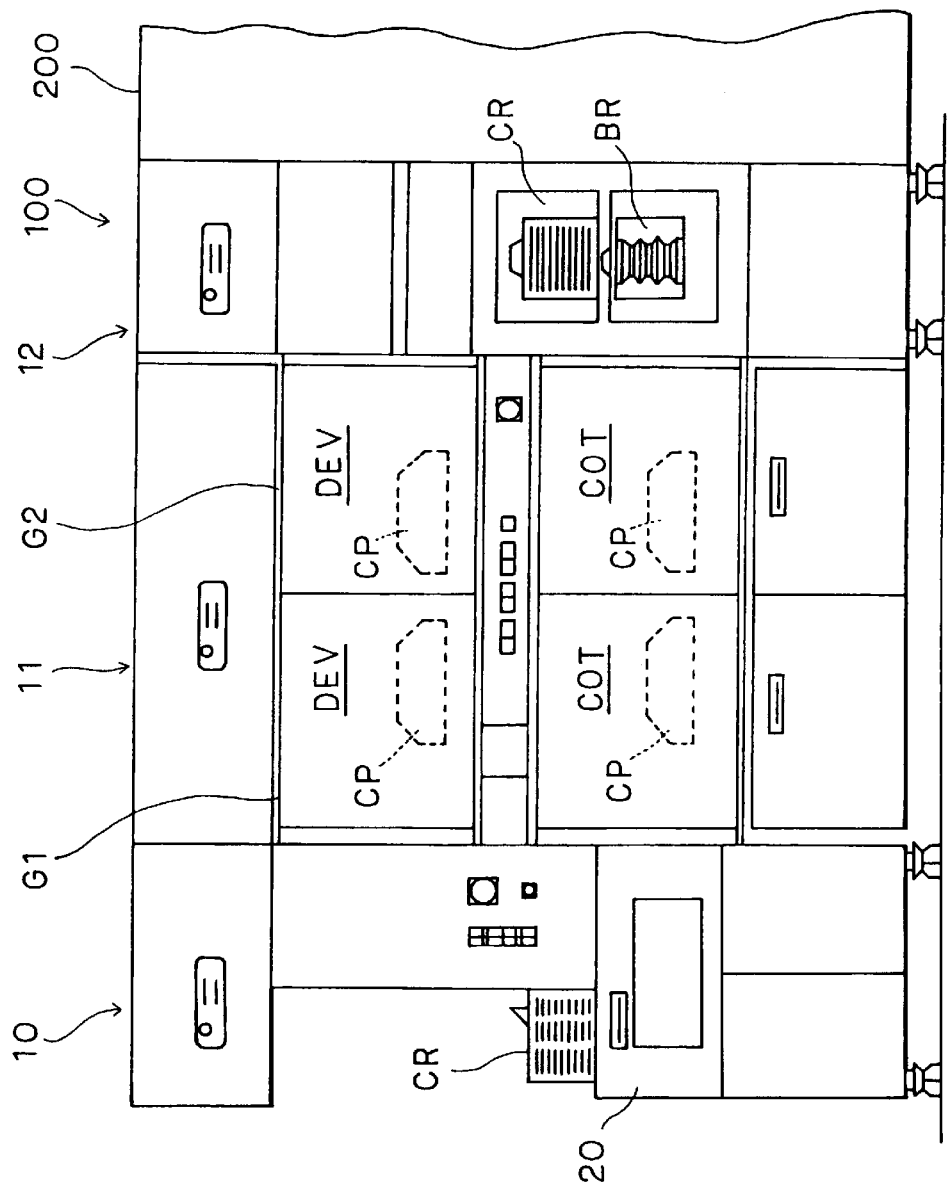
FIG. 2 is a front view of the coating and developing system shown in FIG. 1.
Figure 3:
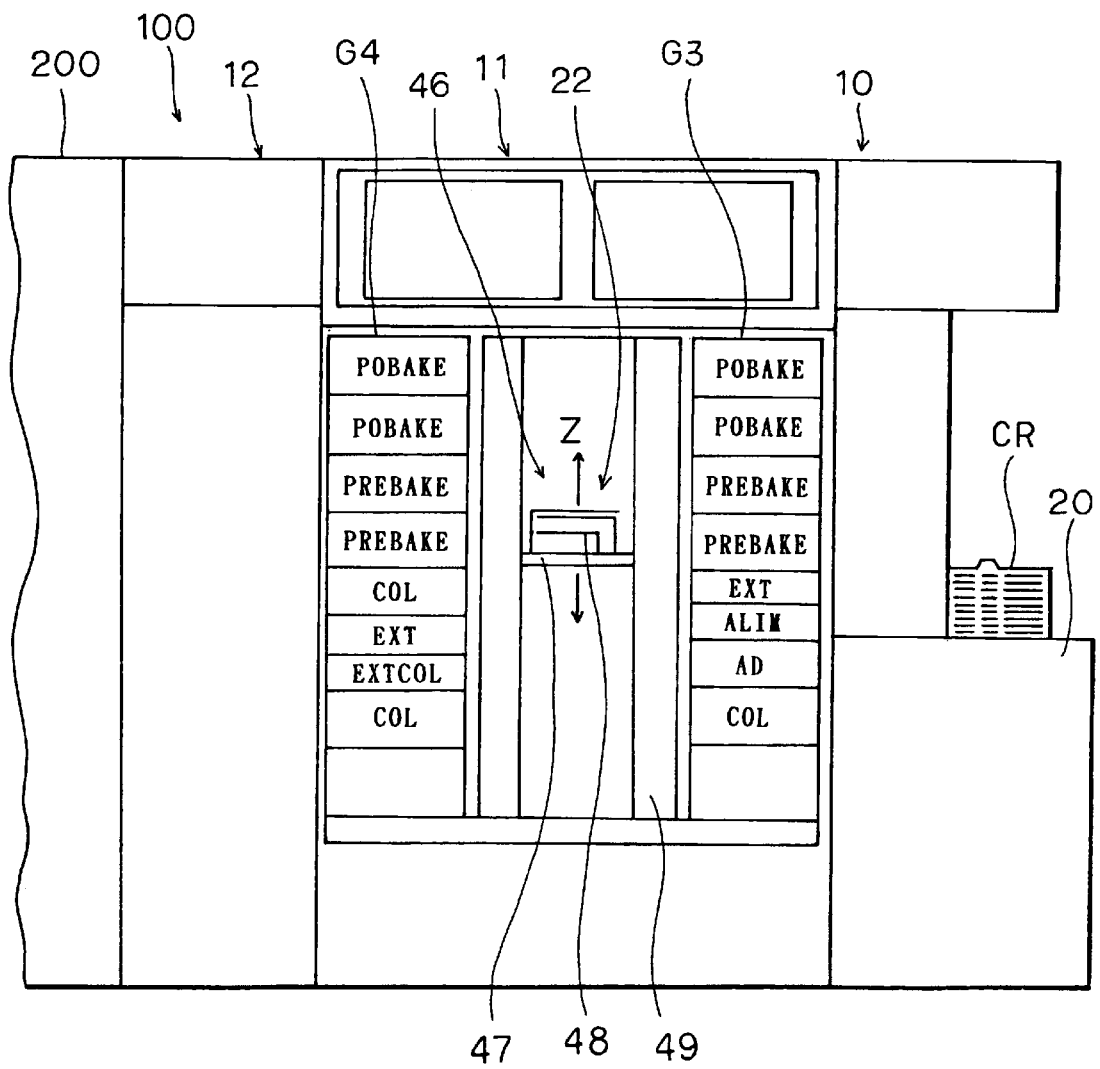
FIG. 3 is a rear view of the coating and developing system shown in FIG. 1.

FIG. 1 to FIG. 3 show the schematic configuration of a coating and developing system for a wafer according to an embodiment of a substrate processing apparatus of the present invention.

As shown in FIG. 1, in a coating and developing system 100, a cassette station 10 for transferring a plurality of wafers W as objects to be processed, for example, 25 wafers per wafer cassette CR from/to the outside to/from the system, and for carrying wafers W into/out of the wafer cassette CR, a process station 11 in which various processing units are multi-tiered at designated positions and each processing unit gives a predetermined processing to the wafers W one by one in a coating and developing process, and an interface section 12 for sending and receiving the wafer W to/from an aligner 200 which is disposed adjacent to the coating and developing system 100 are united. In the cassette station 10, a plurality of, for example, a maximum of four wafer cassettes CR are mounted in a line in an X-direction, with the respective ways in/out for the wafers W open to the process station 11 side at positions of positioning projections 20a on a cassettes mounting table 20. A wafer transferring body 21, which can move in the direction of the disposition of the cassettes CR (X-direction) and in the direction of the disposition of the wafers W housed in the cassettes CR (Z-direction; a vertical direction), is selectively accessible to each wafer cassette CR.

The wafer transferring body 21 is also rotatable in the θ-direction and accessible to an alignment unit (ALIM) and an extension unit (EXT) disposed in multi-tiered units of a third processing unit group $G_3$ on the process station 11 side as described later.

In the process station 11, a vertical transfer-type main wafer transfer mechanism 22 including a wafer transfer device is provided, and all processing units of one group or divided into plural groups are multi-tiered around the main wafer transfer mechanism 22.

Moreover, a chemical cabinet (not shown) for supplying chemicals and for disposing and collecting liquid wastes to/from the coating and developing system 100 is arranged in the vicinity of the coating and developing system 100.

As shown in FIG. 2, in a first processing unit group $G_1$, two spinner-type processing units in which the wafer W is put on a spin chuck to perform predetermined processing in a cup CP, for example, a resist coating unit (COT) and a developing unit (DEV) are two-tiered from the bottom in order. In a second processing unit group $G_2$, two spinner-type processing units, for example, a resist coating unit (COT) and a developing unit (DEV), are two-tiered from the bottom in order. It is preferable to arrange these resist coating units (COT) at the lower stage as described above since drainage of a resist solution is troublesome in terms of mechanism and maintenance. However, it is naturally possible to properly arrange them at the upper stage as required.

As shown in FIG. 3, in the main wafer transfer mechanism 22, a wafer transfer device 46 is provided to be ascendable and descendable in a vertical direction (Z-direction) within a cylindrical supporting body 49. The cylindrical supporting body 49 is connected to a rotating shaft of a motor (not shown) and rotates on the rotating shaft integrally with the wafer transfer device 46 by rotating driving force of the motor. Thereby, the wafer transfer device 46 is rotatable in the θ-direction. Incidentally, the cylindrical supporting body 49 may be connected with another rotating shaft (not shown) rotated by the above motor.

In the wafer transfer device 46, provided are a plurality of holding members 48 movable in the longitudinal direction of a transfer base 47. The holding members 48 permit the delivery of the wafer W between the processing units.

As shown in FIG. 1, five processing unit groups $G_1$, $G_2$, $G_3$, $G_4$, and $G_5$ can be arranged in the coating and developing system 100. It is possible that the multi-tiered units of the first and the second processing unit groups $G_1$ and $G_2$ are arranged at the front side of the system, the multi-tiered units of the third processing unit group $G_3$ are disposed adjacent to the cassette station 10, the multi-tiered units of the fourth processing unit group $G_4$ are disposed adjacent to the interface section 12, and the multi-tiered units of the fifth processing unit $G_5$ are disposed on the rear side.

As shown in FIG. 3, in the third processing unit group $G_3$, open-type processing units in which the wafer W is mounted on a supporting plate (SP shown in FIG. 1) and to undergo predetermined processing, for example, a cooling unit (COL) for cooling processing, an adhesion unit (AD) for performing hydrophobic processing to improve fixedness of resist, an alignment unit (ALIM) for alignment, an extension unit (EXT), a prebaking unit (PREBAKE) for thermal processing before exposure, and a postbaking unit (POBAKE) for thermal processing after exposure are, for example, eight-tiered from the bottom in order. Also in the fourth processing unit group $G_4$, open-type processing units, for example, a cooling unit (COL), an extension and cooling unit (EXTCOL), an extension unit (EXT), a cooling unit (COL), a prebaking unit (PREBAKE), and a postbaking unit (POBAKE) are, for example, eight-tiered in that order from the bottom.

As described above, by arranging a cooling unit (COL) and an extension and cooling unit (EXTCOL) having a low processing temperature at the lower stage and a prebaking unit (PREBAKE), a post baking unit (POBAKE) and an adhesion unit (AD) having a high processing temperature at the upper stage, the mutual thermal interference between units can be reduced. It is natural that random multistage arrangement is possible.

As shown in FIG. 1, the interface section 12 is the same as the process station 11 in depth direction (X-direction) dimension but smaller than the process station 11 in width direction (Y-direction) dimension.

At the front section of the interface section 12, a transportable pickup-type wafer cassette CR and a fixed-type buffer cassette BR are two-tiered, as shown in FIG. 2. In the buffer cassette out of these cassettes, a temperature regulating means for regulating the temperature of the wafer W is provided, as shown in FIG. 4.

More specifically, in the embodiment shown in FIG. 4, a duct 60 for introducing the temperature regulated air into the buffer cassette BR is provided so as to release the temperature regulated air from an air passage 61 provided on the rear side of the buffer cassette BR toward the front side (the outlet/inlet port for the wafers W side) through a number of through holes 62, in order to regulate the temperature of the wafers W placed in the buffer cassette BR.

The temperature regulating means for the wafers W, as shown in FIG. 5, consists of a temperature regulating mechanism of air for BR temperature regulation 101 comprising a heater, a cooler, a temperature sensor, and the like for heating and cooling air, and a BR temperature regulation controller 102 for controlling the temperature regulating mechanism of air for BR temperature regulation 101.

Moreover, as shown in FIG. 5, as a mechanism for regulating the temperature of the wafer W, for example, a temperature regulating plate 201 which can mount thereon the wafer W is provided in the aligner 200. The temperature regulating plate 201 comprises an aligner substrate-temperature regulating mechanism 202 including a temperature regulating section 202a for regulating the temperature by a heater, a cooler and the like and a temperature sensing section 202b consisting of a temperature sensor and the like, an aligner temperature controller 203 for controlling the aligner substrate-temperature regulating mechanism 202, and the like.

The aforesaid BR temperature regulation controller 102 is configured to input a temperature sensed signal by the temperature sensing section 202b of the aligner substrate-temperature regulating mechanism 202, or a control signal which is sent from the aligner temperature controller 203 to the aligner substrate-temperature regulating mechanism 202, so as to regulate a control signal to the temperature regulating mechanism of air for BR temperature regulation 101 in accordance with a tendency of the above signal.

In other words, the target control temperature of the wafers W set in the BR temperature regulation controller 102 is generally set at the same temperature as that in the aligner temperature controller 203.

However, for example, a difference in the temperature control characteristics, the influence of a step of transferring the wafer W after temperature regulation in the buffer cassette BR, and the like, cause a case of further controlling the wafer W mainly in a heating direction and a case of controlling it in a cooling direction on the temperature regulating plate 201 of the aligner 200 after temperature regulation in the buffer cassette BR.

Therefore, when the wafer W is to be mainly controlled in the heating direction on the temperature regulating plate 201 of the aligner 200, the control signal to the temperature regulating mechanism of air for BR temperature regulation 101 is adjusted in the BR temperature regulation controller 102 to slightly raise the temperature setting for temperature regulation in the buffer cassette BR. On the other hand, when the wafer W is to be mainly controlled in the cooling direction on the temperature regulating plate 201 of the aligner 200, the signal is adjusted to slightly lower the temperature setting for temperature regulation in the buffer cassette BR.

By regulating the temperature of the wafer W in the buffer cassette BR as above, the temperature of the wafer W on the temperature regulating plate 201 of the aligner 200 can be regulated in a shorter time and with more accuracy.

Furthermore, as shown in FIG. 1, a peripheral aligner 23 is disposed at the back portion of the interface section 12.

As shown in FIG. 1, a substrate transfer device 24 is disposed in the central portion of the interface section 12. The substrate transfer device 24 moves in the X-direction and in the Z-direction to be accessible to both of the cassettes CR and and the peripheral aligner 23.

The substrate transfer device 24 is also rotatable in the θ-direction to be accessible to the extension unit (EXT) arranged in the multi-tiered units of the fourth processing unit group $G_4$ on the process station 11 side and to a wafer delivery stand (not shown) on the adjacent aligner 200 side.

If a transfer mechanism similar to the main wafer transfer mechanism 22 provided in the process station 11 is provided as the substrate transfer device 24 to be accessible to the multi-tiered units of the fourth processing unit group $G_4$ from the interface section 12 side, a load on the main wafer transfer mechanism 22 can be reduced and the speeding up of the processing can be achieved by improvement in the transferring capability to the wafer W.

In the coating and developing system 100, the multi-tiered units of the fifth processing unit group $G_5$ shown by the broken line in FIG. 5 can be also disposed on the rear face side of the main wafer transfer mechanism 22 as described above. The multi-tiered units of the fifth processing unit group $G_5$ are movable in the Y-direction along guide rails 25. Accordingly, even when the multi-tiered units of the fifth processing unit group $G_5$ are provided as shown in the illustration, the multi-tiered units move along the guide rails 25, thereby securing a space. As a result, the maintenance operation for the main wafer transfer mechanism 22 can be easily carried out from the back thereof.

Next, the flow of the processing of the wafer W by the coating and developing system 100.

First, the wafer transferring body 21 makes access to the cassette CR housing unprocessed wafers W on the cassette mounting table 20 and takes one wafer W out of the cassette CR. Then, the wafer transferring body 21 delivers the wafer W to the main wafer transfer mechanism 22 on the process station 11 side via the alignment unit (ALIM) and the like of the third processing unit group $G_3$.

The main wafer transfer mechanism 22 takes out the wafer W which has completed orientation flat adjustment and centering in the above alignment unit (ALIM) and carries the wafer W into the adhesion unit (AD) of the third processing unit group $G_3$ to apply hydrophobic processing thereto.

The wafer W which has completed hydrophobic processing is carried into a predetermined prebaking unit (PREBAKE) by the main wafer transfer mechanism 22 to be baked, thereafter carried into a predetermined cooling unit (COL). The wafer W is cooled to a set temperature before resist coating processing, for example, 23° C. in the cooling unit (COL).

When the cooling processing is completed, the wafer W is carried into the predetermined resist coating unit (COT) by the main wafer transfer mechanism 22, and the surface of the wafer W is coated with a resist in the resist coating unit (COT).

When the resist coating processing is completed, the main wafer transfer mechanism 22 takes the wafer W out of the resist coating unit (COT) and carries it again into the predetermined prebaking unit (PREBAKE). The wafer W is heated at a predetermined temperature, for example, at 100° C. for a predetermined period of time, thereby removing the remaining solvent from the coating film on the wafer W by evaporation.

Then, the wafer W is carried into the extension and cooling unit (EXTCOL) by the main wafer transfer mechanism 22. The wafer W is cooled to a predetermined temperature, for example, 24° C. suitable for the following step, that is, a peripheral exposure processing by the peripheral aligner 23.

Thereafter, the aforesaid substrate transfer device 24 provided in the interface section 12 takes the wafer W out of the extension and cooling unit (EXTCOL), thereby the wafer W is delivered to the substrate transfer device 24.

Then, the substrate transfer device 24 carries the wafer W into the peripheral aligner 23 in the interface section 12, where the wafer W undergoes exposure processing at the periphery.

When the peripheral exposure processing is completed, the substrate transfer device 24 carries the wafer W out of the peripheral aligner 23 and transfers it to the wafer delivery stand (not shown) on the adjacent aligner 200 side. In this case, the wafer W is temporarily housed in the buffer cassette BR as required before being transferred to the aligner 200.

The wafer W temporarily housed in the buffer cassette BR is regulated in temperature, as described above, in reference to the condition of temperature regulation in the aligner 200.

Accordingly, temperature regulation of the wafer W can be performed in a shorter time and with more accuracy on the side of the aligner 200 in which temperature regulation of the wafer W with high accuracy is required.

As described above, after the wafer W is delivered to the aligner 200, the wafer W undergoes exposure processing using a reticle by the alginer 200. After the exposure processing for the entire surface of the wafer W in the aligner 200 is completed, the wafer W is delivered again to the substrate transfer device 24 in the interface section 12.

The wafer W is then delivered from the substrate transfer device 24 to the process station 11 side. In this stage, the wafer W may be temporarily housed in the buffer cassette BR in the interface section 12 as required before being delivered to the process station 11 side.

Thereafter, the main wafer transfer mechanism 22 in the process station 11 carries the received wafer W into the predetermined postbaking unit (POBSKE). The wafer W is mounted on a hot plate to undergo baking processing for a predetermined period of time.

The baked wafer W is then carried into any one of the cooling units (COL) by the main wafer transfer mechanism 22, where the wafer W is returned to an ordinary temperature. Sequentially, the wafer W is carried into a predetermined developing unit (DEV) by the main wafer transfer mechanism 22.

In the developing unit (DEV), the wafer W is mounted on the spin chuck, and the resist on the surface of the wafer W is uniformly sprayed with a developing solution, for example, by a spray method and developed. After development, a rinse solution is applied to the surface of the wafer W to rinse the developing solution. The wafer W is then rotated at high speed to be dried.

Thereafter, the main wafer transfer mechanism 22 takes the wafer W out of the developing unit (DEV) and carries it again into the predetermined postbaking unit (POBAKE). In the postbaking unit (POBAKE), the wafer W is heated, for example, at 100° C. for a predetermined period of time, thereby curing the resist swelled by development and improving chemical resistance.

When postbaking processing is completed, the main wafer transfer mechanism 22 carries the wafer W out of the postbaking unit, and then carries it into the predetermined cooling unit (COL) where cooling processing is applied thereto.

After the wafer W returns to an ordinary temperature, the main wafer transfer mechanism 22 delivers the wafer W to the cassette station 10 side. The wafer transferring body 21 on the cassette station 10 side puts the received wafer W into a predetermined wafer housing groove of the cassette CR for housing of the treated wafers on the cassette mounting table 20.

Figure 6:
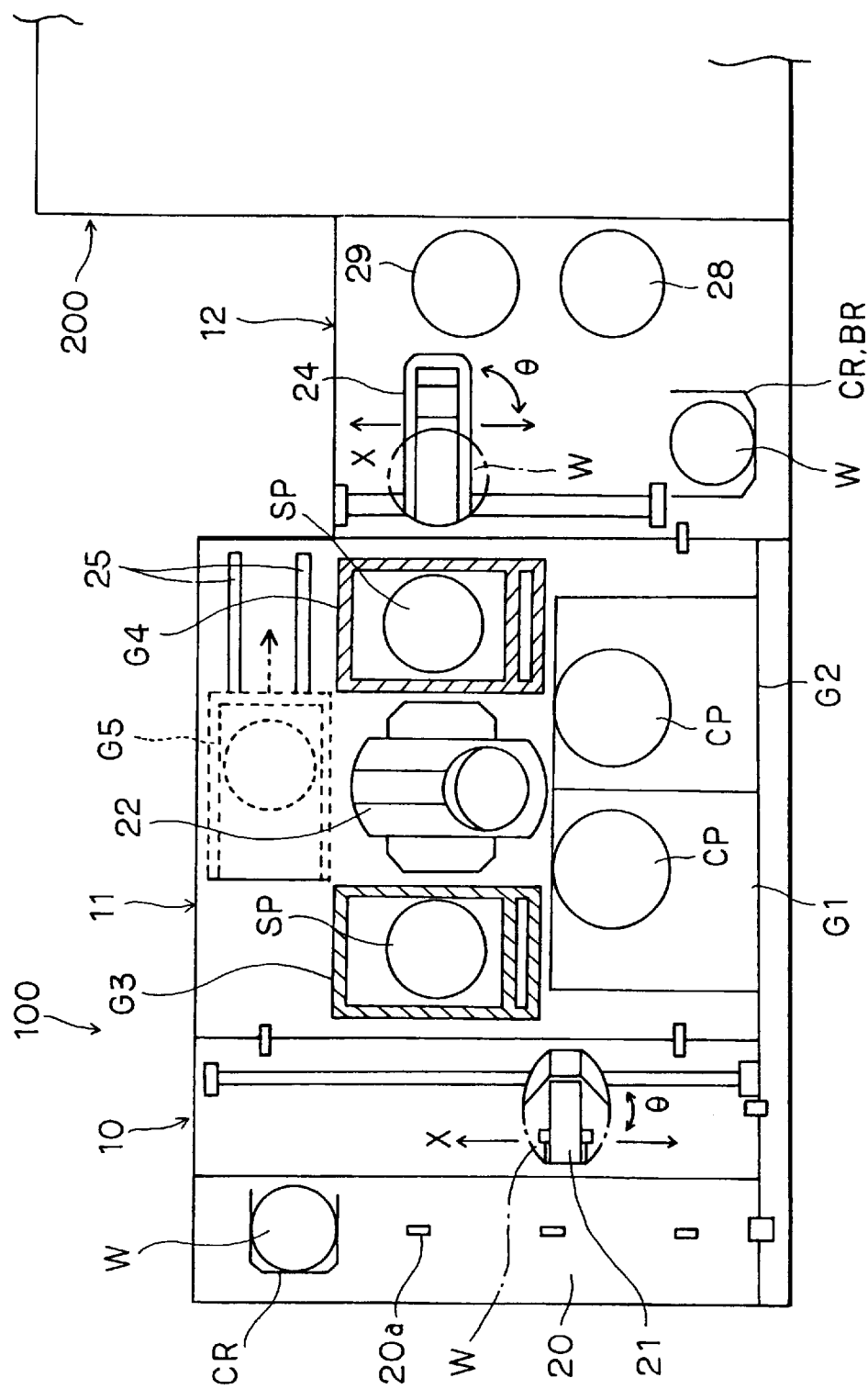
FIG. 6 is a plan view of a coating and developing system according to another embodiment of the present invention.

FIG. 6 shows the configuration of another embodiment, in this embodiment, an inlet-side delivery stage 28, an outlet-side delivery stage 29 are provided in the interface section 12 as stages for delivering the wafer W to/from the aligner 200.

The substrate transfer device 24 mounts the wafer W on the inlet-side delivery stage 28, and a transfer mechanism (not shown) on the aligner 200 side receives the wafer W on the inlet-side delivery stage 28, thereby delivering the wafer W to the aligner 200. In a reverse order, the wafer W is delivered from the aligner 200 to the coating and developing system 100 via the outletside delivery stage 29.

Figure 7:
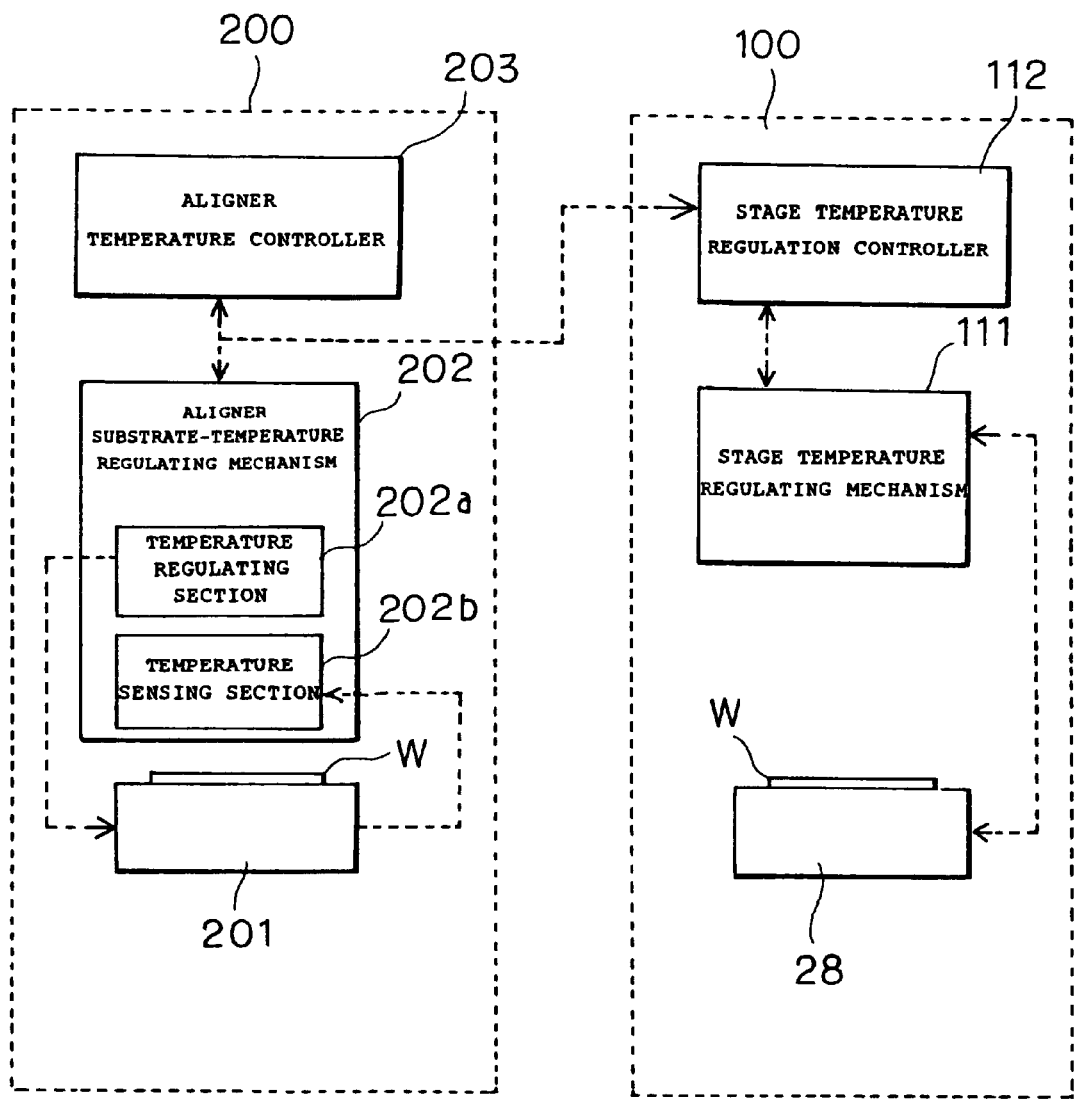
FIG. 7 is an explanatory view of a temperature regulating means according to another embodiment.

Moreover, in the inlet-side delivery stage 28 for delivering the wafer W to the aligner 200 side, provided is a temperature regulating means for regulating the temperature of the wafer W. The temperature regulating means, as shown in FIG. 7, consists of a stage temperature regulating mechanism 111 composed of a heater, a cooler, a temperature sensor, and the like for heating and cooling the inlet-side delivery stage 28, and a stage temperature regulation controller 112 for controlling the stage temperature regulating mechanism 111.

The stage temperature regulation controller 112, as similarly to the BR temperature regulation controller 102, is configured to input a temperature sensed signal by the temperature sensing section 202b of the aligner substrate-temperature regulating mechanism 202, or a control signal which is sent from the aligner temperature controller 203 to the aligner substrate-temperature regulating mechanism 202, so as to regulate a control signal to the stage temperature regulating mechanism 111 in accordance with a tendency of the above signal.

In other words, as described above, when the wafer W is to be mainly controlled in the heating direction on the temperature regulating plate 201 of the aligner 200, the control signal to the stage temperature regulating mechanism 111 is adjusted in the stage temperature regulation controller 112 to slightly raise the temperature setting. On the other hand, when the wafer W is to be mainly controlled in the cooling direction on the temperature regulating plate 201 of the aligner 200, the signal is adjusted to slightly lower the temperature setting.

By regulating the temperature of the wafer W at the inlet-side delivery stage 28 as above, the temperature of the wafer W can be regulated until just before the delivery of the wafer W to the aligner 200 at a position where the wafer W is delivered to the aligner 200. Furthermore, as described above, the temperature is regulated in reference to the condition of temperature regulation in the aligner 200, so that the temperature of the wafer W on the temperature regulating plate 201 of the aligner 200 can be regulated in a shorter time and with more accuracy.

In this case, by using temperature regulation in the buffer cassette BR in the above described embodiment together, that is, by performing both temperature regulation of the wafer W in the buffer cassette BR and temperature regulation of the wafer W at the inlet-side delivery stage 28, temperature regulation can be more efficiently and accurately performed.

Furthermore, in this embodiment, as shown in FIG. 6, a peripheral aligner is not disposed in the interface section 12, therefore the length of the interface section 12 in the X-direction is small as compared with that of the aforesaid structure in FIG. 1. Therefore, access to the aligner 200 on the occasion of a maintenance operation and the like can be easily made.

Particularly, in the aligner 200, maintenance operations and the like need to be performed to the exposure stage at frequent intervals. Conventionally, the interface section 12 in the coating and developing system 100 needs to be drawn out for obtaining access to the exposure stage in the aligner 200 from the coating and developing system 100 side of the aligner 200. In the configuration shown in FIG. 6, the length of the interface section 12 in the X-direction is small, so that easy access is possible to the side face of the aligner 200 (the coating and developing system 100 side) from the rear side without drawing the interface section 12 out.

In the above configuration, the peripheral aligner is disposed at any position of processing unit groups in the aforesaid process station 11.

As has been described, according to each embodiment, temperature regulation is performed at the buffer cassette BR or the inlet-side delivery stage 28 of a position for delivering the wafer W to the aligner 200, or at both of these in reference to the condition of temperature regulation of the wafer W in the aligner 200, so that temperature regulation of the wafer W on the temperature regulating plate 201 of the aligner 200 can be performed in a shorter time and with more accuracy.

Accordingly, circuit patterns can be accurately transferred, and throughput can be improved by speeding up the processing.

Next, still another embodiment of the present invention will be described.

Figure 8:
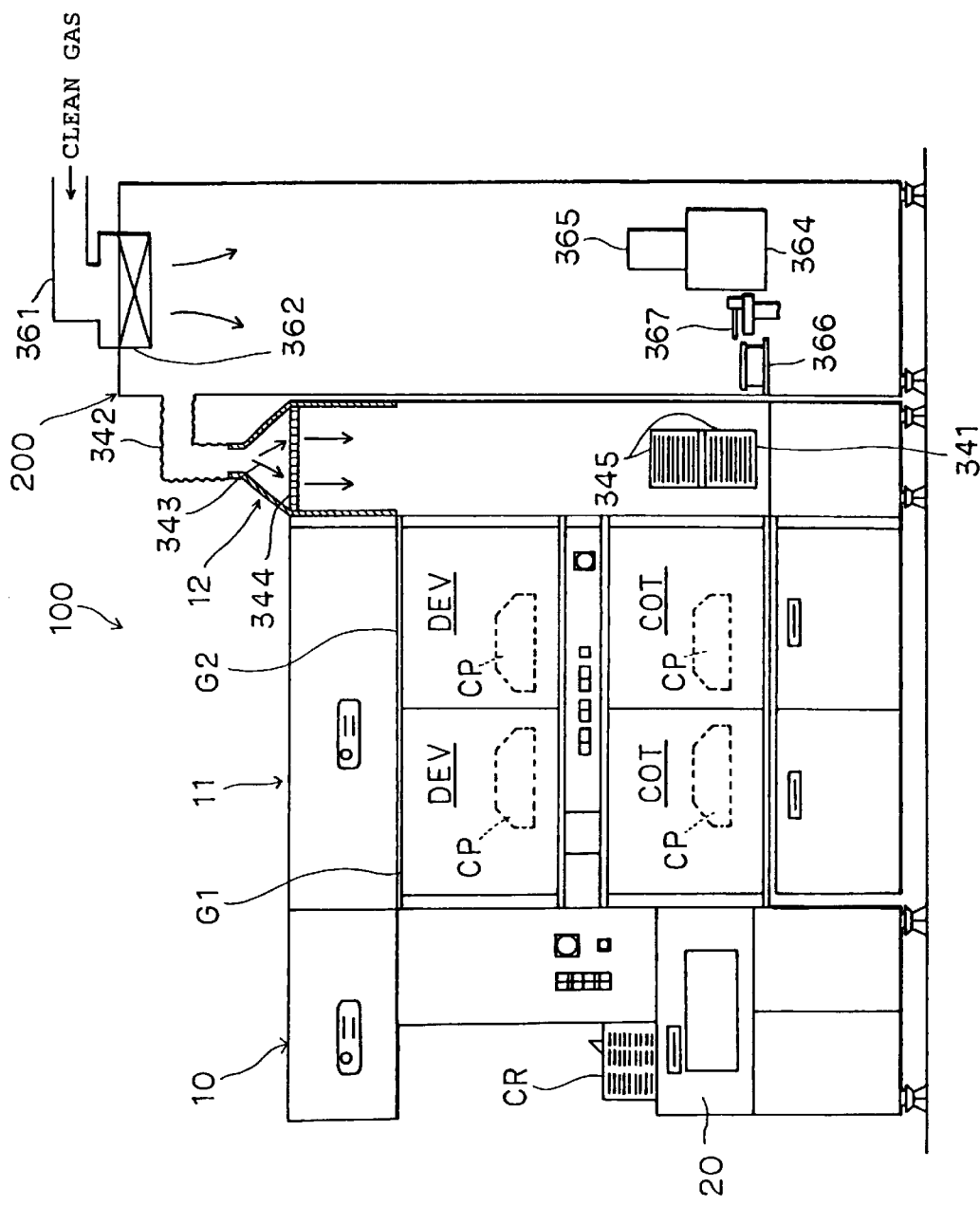
FIG. 8 is a plan view of a coating and developing system according to still another embodiment of the present invention.
Figure 9:
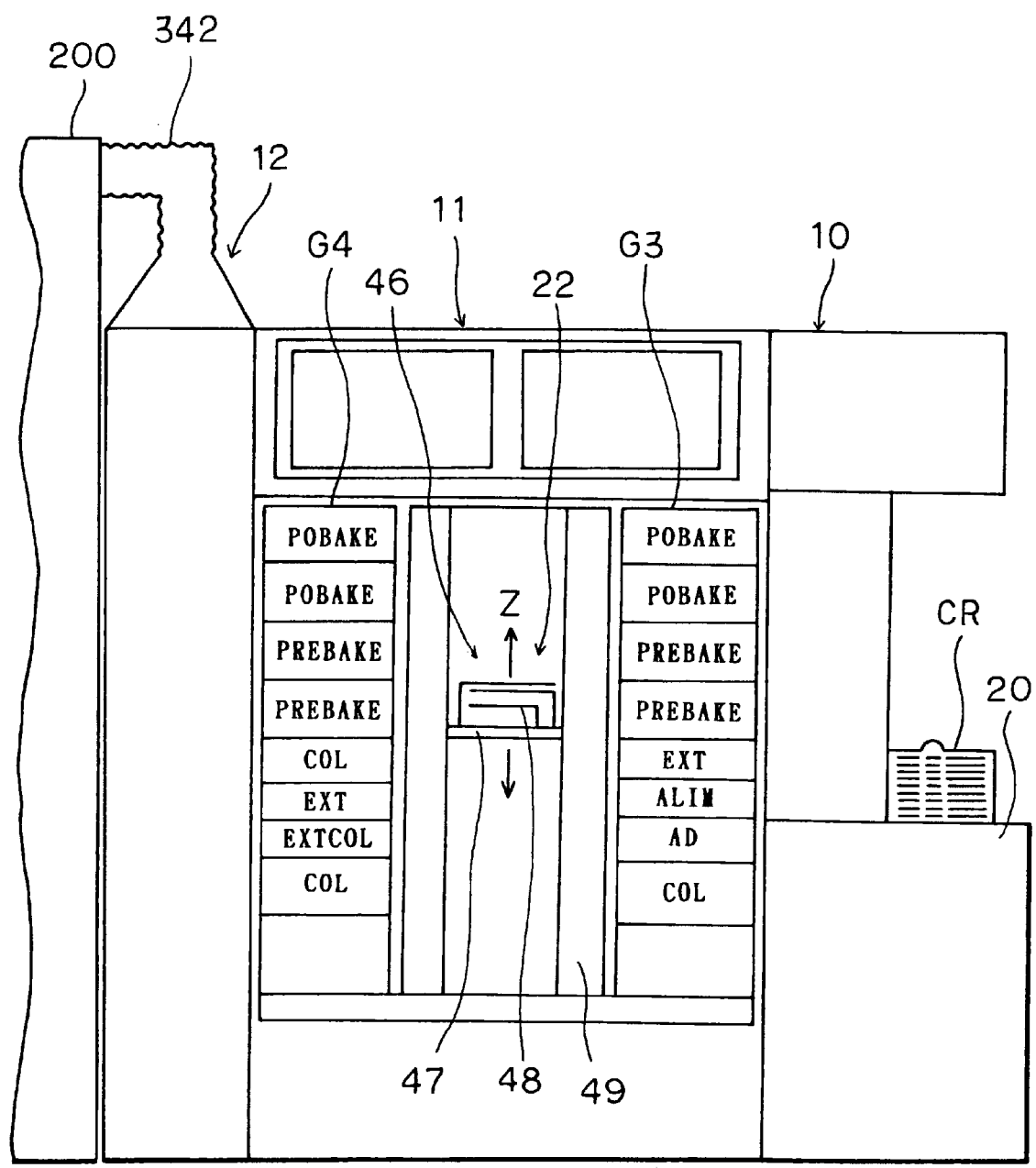
FIG. 9 is a rear view of the coating and developing system shown in FIG. 8.

As shown in FIG. 8 and FIG. 9, temperature regulated clean gas is supplied from the outside into the aligner 200 through an air supply duct 361 and a filter 362, thereby the inside of the aligner 200 is regulated at a predetermined atmosphere temperature. In the interface section 12, provided is a buffer cassette 341 in which the wafer W coated with a resist before exposure is temporarily placed. Clean gas is supplied from the aligner 200 into the interface section 12 through a duct 342 to make the atmosphere temperature around the wafer W in the buffer cassette 341 become the same as that in the aligner 200.

The inside of the aligner 200 is under positive pressure by the clean gas supplied from the outside. On the other hand, the inside of the interface section 12 is naturally exhausted to be under normal pressure. Therefore, even if a blowing means such as a fan or the like is not provided between the aligner 200 and the interface section 12, clean gas is supplied from the aligner 200 to the interface section 12 only by opening a hole in the aligner 200 and connecting the duct 342 thereto.

In the embodiment shown in FIG. 8, a draft chamber 343, which is communicated to the bottom of the duct 342 and in a form widening toward the end, is formed at the top of the interface section 12. In the vicinity of the bottom side of the draft chamber 343, that is, the ceiling section of the interface section 12, provided is a diffusion plate 344 made of, for example, punching metal to thereby diffuse the clean gas supplied from the duct 342 into the draft chamber 343 and to blow out it into the interface section 12 uniformly.

The buffer cassette 341 is composed of, for example, holding shelves 345 for buffer in two-tiered. The holding shelf 345 has a plurality of shelves projecting from both side plates of the cassette toward inside on which both ends of the wafer W are placed to hold. Since the processing speeds between the coating and developing system 100 and the aligner 200 are discrepant, the wafer W coated with a resist before exposure and the wafer W after exposure waiting for developing processing are temporarily housed in the respective holding shelves 345 to absorb the processing speed discrepancies.

Moreover, the aligner 200 includes a before processing stage 363 for mounting thereon the wafer W before exposure, a vacuum chamber 364 for performing exposure, an electron gun 365 for exposure, an after processing stage 366 for mounting thereon the wafer W after exposure, and a transferring arm 367 for transferring the wafer W between each of stages 363 and 366, and the vacuum chamber 364.

The wafer W sent from the process station 11 to the interface section 12 is temporarily housed in the holding shelf 345 in the interface section 12 and is adjusted to the same temperature as the atmosphere temperature in the aligner 200, and then is sent to the aligner 200. After exposure, the wafer W is returned to the interface section 12 and exposed only on the peripheral section in the peripheral aligner 23, thereafter is temporarily housed in the holding shelf 345 when there is no vacancy in the developing unit (DEV). The wafer W is then delivered to the process station 11 side.

According to the above embodiment, the temperature regulated clean gas is supplied from the outside into the aligner 200, thereby the inside of the aligner 200 is regulated in temperature. Moreover, the temperature regulated clean gas is supplied from the aligner 200 into the interface section 12 through the duct 342, the draft chamber 343 and the diffusion plate 344, and thereby the inside of the interface section 12 is also regulated in temperature. Therefore, the temperature in the interface section 12 is kept at the same degree as that in the aligner 200 only by communicating the aligner 200 and the interface section 12 using the duct 342, without providing an exclusive temperature regulating mechanism and an exclusive heating means for the interface section 12. Consequently, a pattern forming apparatus and a coating and developing apparatus without necessity of fine temperature regulation in the interface section 12, can be obtained at low cost.

Figure 10:
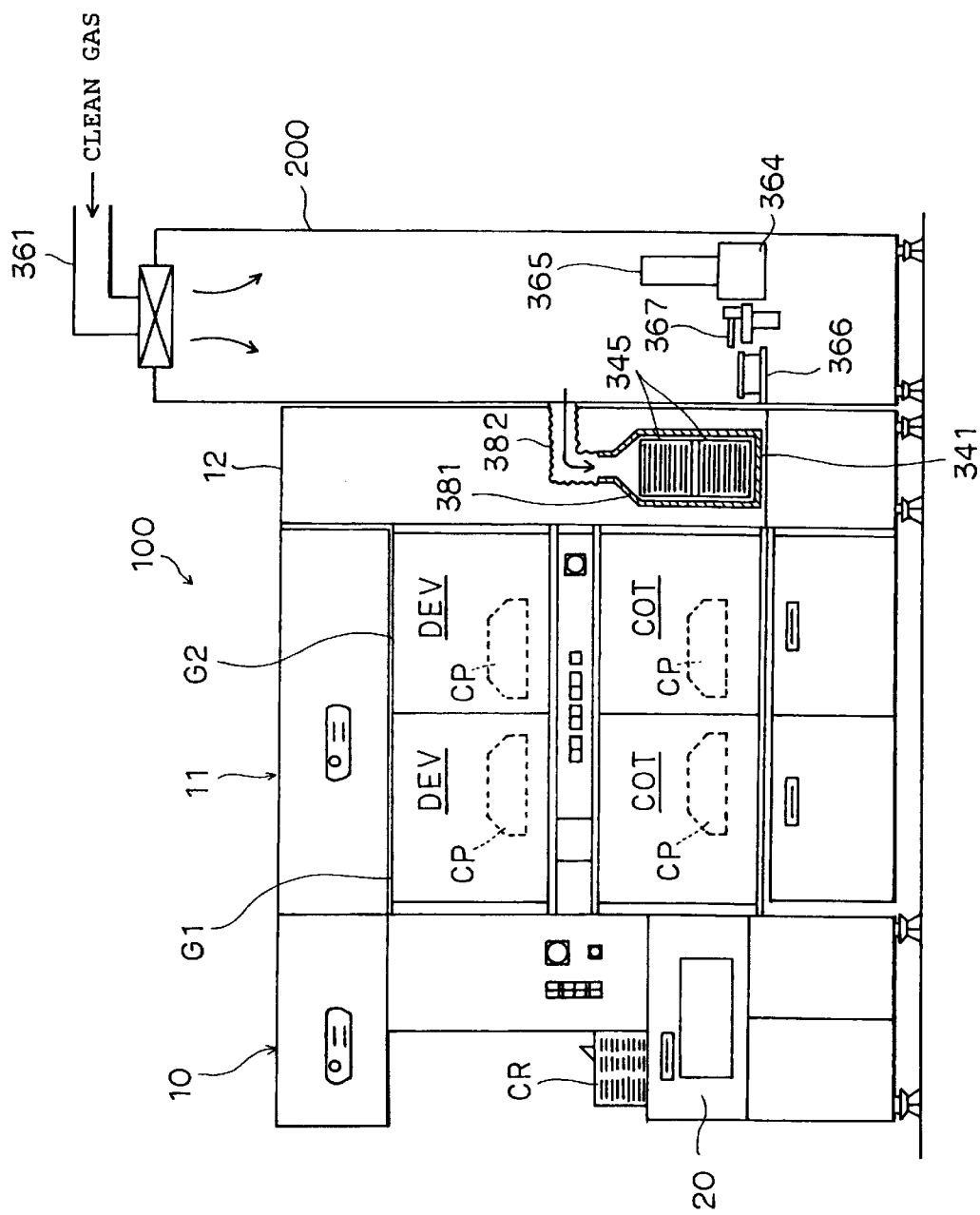
FIG. 10 is a front view of a coating and developing system according to further still another embodiment of the present invention.
Figure 11:
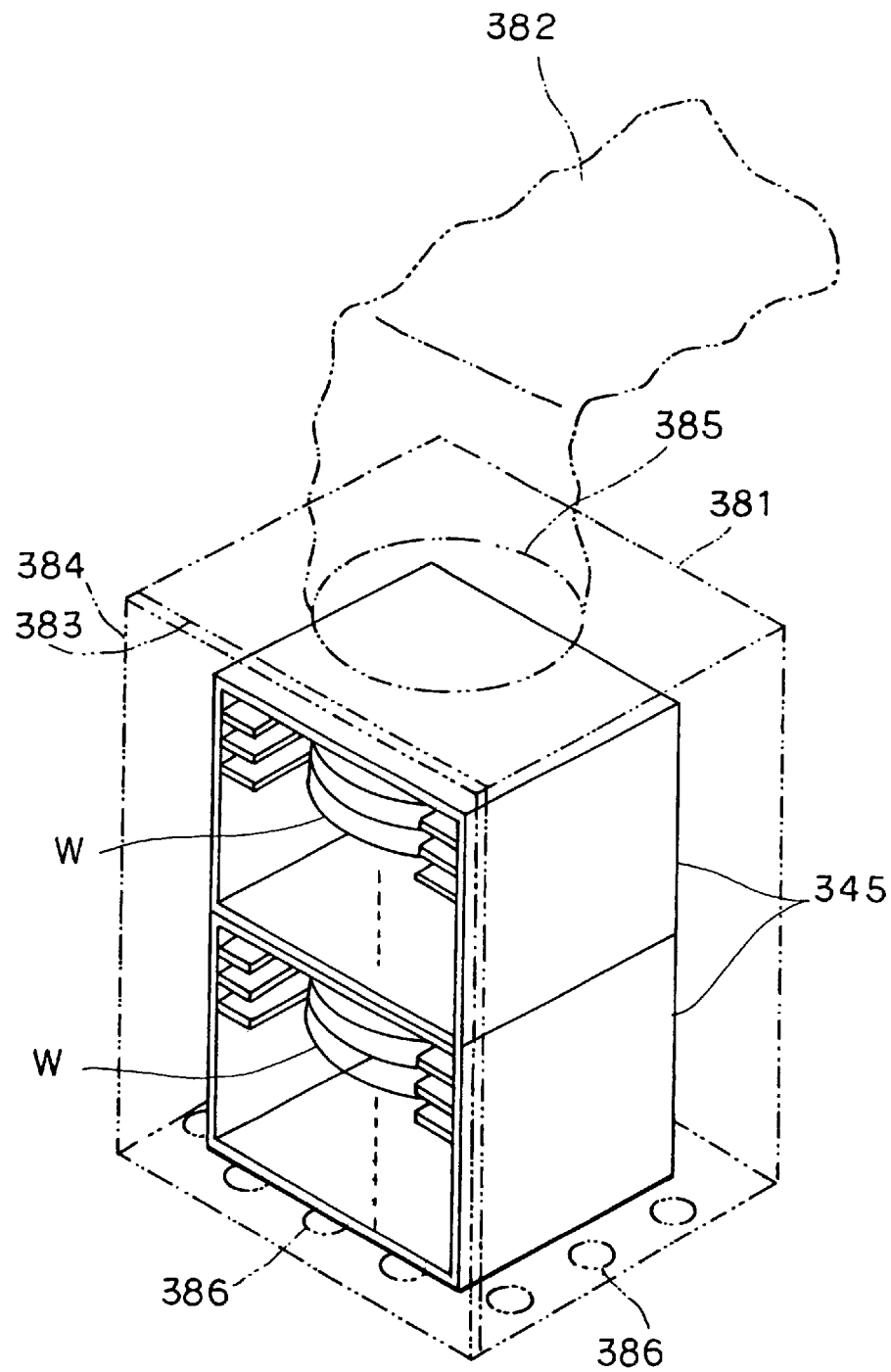
FIG. 11 is a perspective view of the buffer cassette shown in FIG. 10.

In FIG. 10 and FIG. 11, further still another embodiment of the present invention is shown.

This apparatus is different from that shown in FIG. 8 and FIG. 9 in which the temperature regulated clean gas is spread out to the entire inside of the interface section 12, in the following point. The apparatus shown in FIG. 10 and FIG. 11 is configured in such a manner that the holding shelves 345 are covered with a cover 381, and the cover 381 and the aligner 200 are communicated through a duct 382 and the like, and the temperature regulated clean gas supplied into the aligner 200 is supplied only into the cover 381, thereby the temperature of the wafer W before exposure housed in the holding shelves 345 is controlled.

The cover 381 is a transfer port 383, for example, in the front face thereof, and the transfer port 383 is provided with a door 384 which is opened and closed by a driving mechanism (not shown). The door 384 opens when the wafer W is carried into/out of the holding shelves 345, and is closed at the other times. The duct 382 is connected to a gas supply port 385 which is provided, for example, at the ceiling section of the cover 381. Moreover, exhaust ports 386 are provided, for example, at the floor section of the cover 381. Accordingly, a flow of the clean gas from the top to the bottom in the cover 381 is produced, therefore it is preferable that the wafer W before exposure of which the surface needs to be kept normal is housed in the upper holding shelf 345. The gas exhausted from the exhaust ports 386 to outside the cover 381 is not returned into the aligner 200 and the cover 381 due to danger of a low cleanliness.

It is noted that a blowing means such as a fan may be provided at midpoints of the ducts 342 and 382, or the temperature regulated clean gas may not be supplied to the holding shelves 345 in which the wafer W after exposure is housed. In the apparatus shown in FIG. 10, a mounting section for the wafer W except for the holding shelves 345 for a buffer may be provided and covered with a cover to introduce thereto the temperature regulated clean gas from the aligner 200.

Next, one more another embodiment of the present invention will be described.

Figure 12:
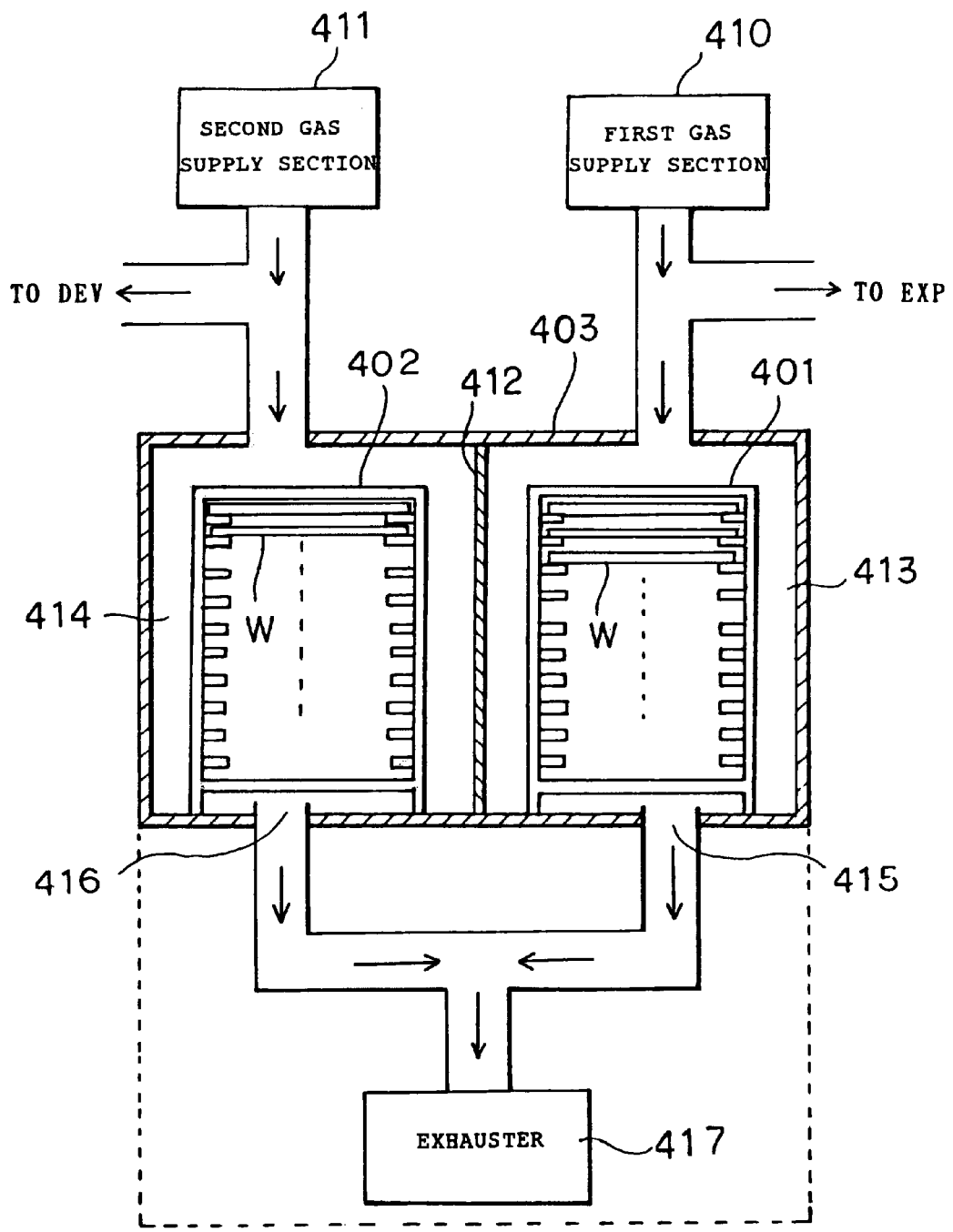
FIG. 12 is a side view of a stage according to one more another embodiment of the present invention.
Figure 13:
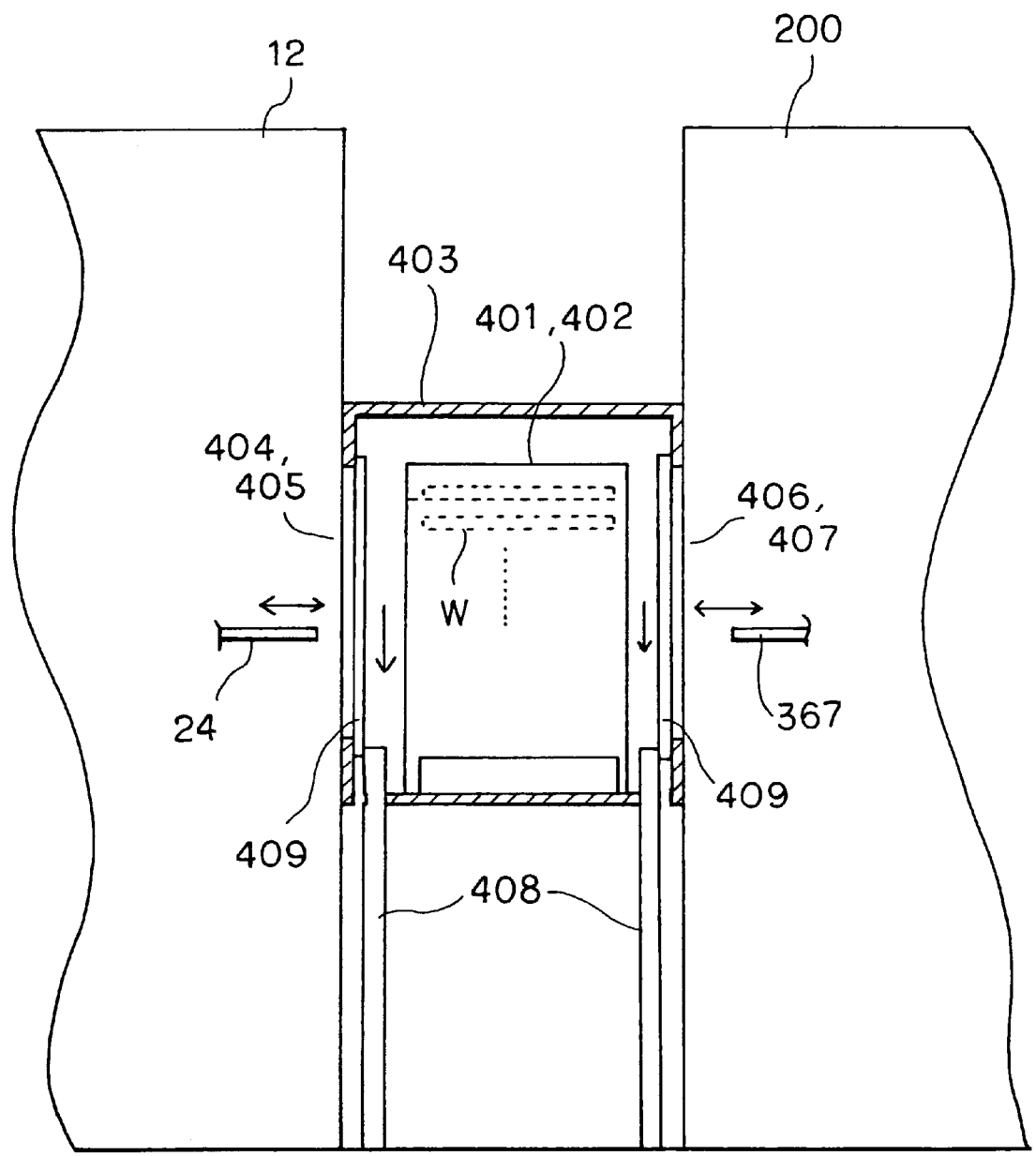
FIG. 13 is a front view of the stage shown in FIG. 12.

In the embodiment shown in FIG. 6, the inlet-side delivery stage 28 and the outlet-side delivery stage 29 are provided in the interface section 12. In this embodiment, as shown in FIG. 12 and FIG. 13, these stages are replaced with an inlet-side delivery housing section 401, and an outlet-side delivery housing section 402 in which the above stages are multi-tiered respectively. In the inlet-side delivery housing section 401, the wafer W to be delivered to the aligner 200 is housed. In the outlet-side delivery housing section 402, the wafer W delivered from the aligner 200 is housed.

The inlet-side delivery housing section 401 and the outlet-side delivery housing section 402 are covered with a cover 403. Moreover, opening sections 404 and 405 are respectively provided on the interface section 12 side of the cover 403 so that the substrate transfer device 24 can make access to the wafer W housed in the inlet-side delivery housing section 401 and the outlet-side delivery housing section 402. Furthermore, opening sections 406 and 407 are respectively provided on the aligner 200 side of the cover 403 so that the transferring arm 367 of the aligner 200 can make access to the wafer W housed in the inlet-side delivery housing section 401 and the outlet-side delivery housing section 402. At the openings 404 to 407 is provided a door 409 which is opened and closed by a driving mechanism 408. The door 409 opens when the wafer W is carried into/out of the inlet-side delivery housing section 401 or the outlet-side delivery housing section 402, and is closed at the other times.

In FIG. 12, a numeral 410 is a first gas supply section for supplying the temperature regulated clean gas (air) to the aligner 200, and a numeral 411 is a second gas supply section for supplying the temperature regulated clean gas (air) to the developing unit (DEV). The inside of the cover 403 is divided into two, a first and a second chamber 413 and 414, with a partition 412. The inlet-side delivery housing section 401 is disposed in the first chamber 413, and the outlet-side delivery housing section 402 is disposed in the second chamber 414.

In this embodiment, the temperature regulated clean gas supplied from the first gas supply section 410 is supplied from the upper section of the first chamber 413 in which the inlet-side delivery housing section 401 is disposed. The temperature regulated clean gas supplied from the second gas supply section 411 is supplied from the upper section of the second chamber 414 in which the outlet-side delivery housing section 402 is disposed.

An exhaust port 415 is provided at the lower part of the first chamber 413, and an exhaust port 416 is provided at the lower part of the second chamber 414. To the exhaust ports 415 and 416, an exhauster 417 is connected, and the first and second chambers 413 and 414 are exhausted by the exhauster 417.

In this embodiment, the inlet-side delivery stage 28 and the outlet-side delivery stage 29 in the interface section 12 shown in FIG. 6, are replaced with the inlet-side delivery housing section 401 and the outlet-side delivery housing section 402 in which the above stages are multi-tiered respectively, thereby eliminating the need for provision of a buffer cassette BR in the interface section 12. Accordingly, downsizing of the apparatus can be achieved, and workers are easily accessible to the inside of the apparatus, so that maintenance operations and the like become easy to perform.

Moreover, the door 409 is provided at each of openings 404 to 407 of the cover 403, and is closed except when the wafer W is carried into/out of the inlet-side delivery housing section 401 and the outlet-side delivery housing section 402, thereby preventing particles from flowing out into the aligner 200 side.

Furthermore, in this embodiment, the same gas as that is supplied into the aligner 200 is supplied into the first chamber 413 in which the inlet-side delivery housing section 401 is disposed, thereby the wafer W before exposure is placed in the same circumstances (temperature and humidity) as that at exposure. Accordingly, an exposing processing in the aligner 200 can be performed more precisely in a shorter time. On the other hand, the same gas as that is supplied into the developing unit (DEV) is supplied into the second chamber 414 in which the outlet-side delivery housing section 402 is disposed, thereby the wafer W before development is placed in the same circumstances (temperature and humidity) as that at development. Accordingly, a developing processing in the developing unit (DEV) can be performed more precisely in a shorter time.

FIG. 14 is an explanatory view of a modification of the embodiment shown in FIG. 12 and FIG. 13.

In the embodiment shown in FIG. 14, each of the openings 504 to 507 of a cover 503 is sized so as to take at least one wafer W in and out. Moreover, hoisting and lowering mechanisms 520 and 521 for ascending and descending an inlet-side delivery housing section 501 and an outlet-side delivery housing section 502, are respectively provided, for example, at the bottom parts of the inlet-side delivery housing section 501 and the outlet-side delivery housing section 502. By the ascending and descending motions of the hoisting and lowering mechanisms 520 and 521, portions in the inlet-side delivery housing section 501 and the outlet-side delivery housing section 502 which need to be delivered, are adjusted to the openings 504 to 507.

In this embodiment, the openings 504 to 507 are quite small in size, which can further prevent particles from flowing out into the aligner 200 side.

Figure 15:
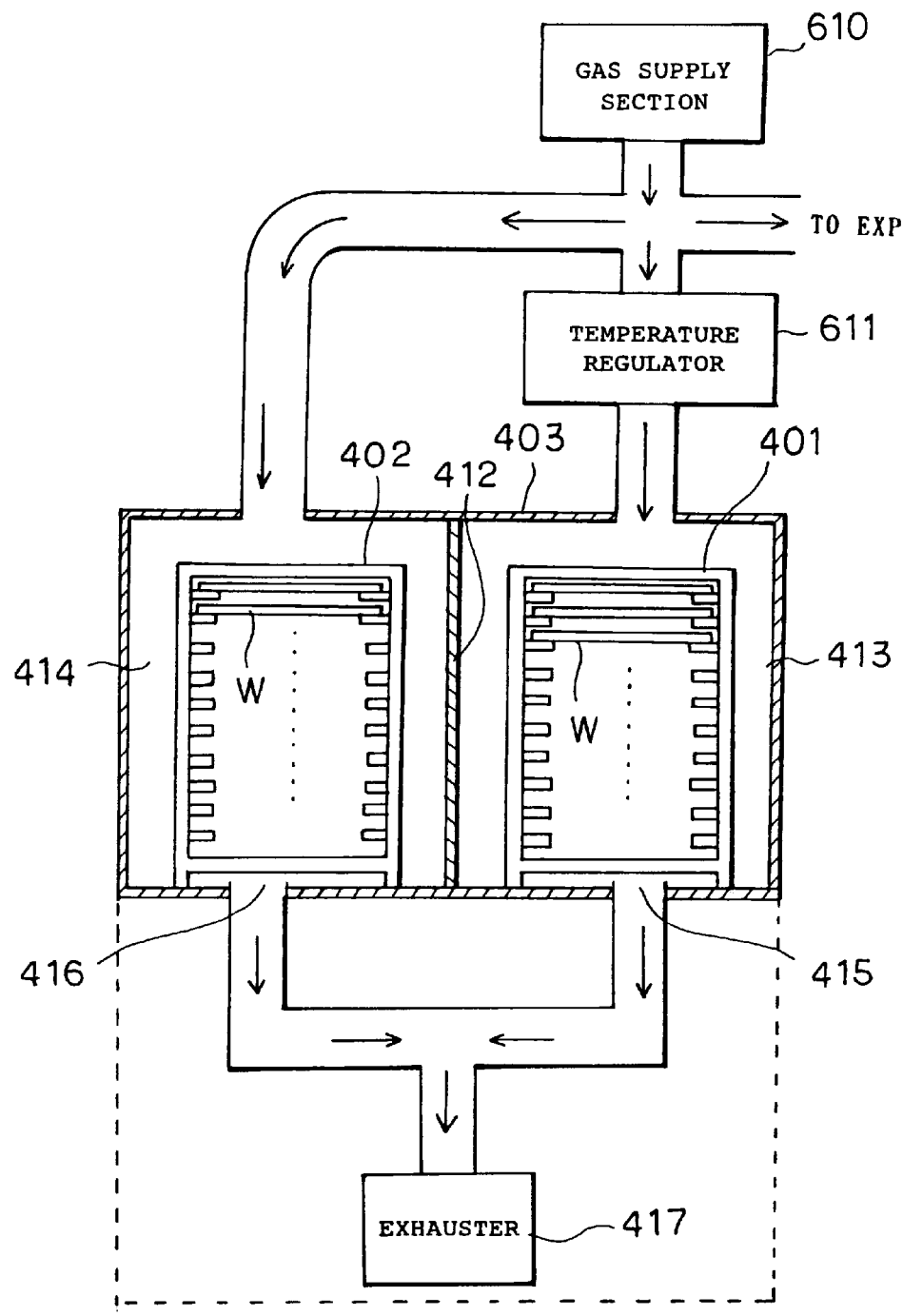
FIG. 15 is a side view of the stage according to the modification of the embodiment shown in FIG. 12 and FIG. 13.

FIG. 15 is an explanatory view of another modification of the embodiment shown in FIG. 12 and FIG. 13.

A numeral 610 in FIG. 15 is a gas supply section for supplying temperature regulated clean gas (air) to the aligner 200. In this embodiment, the clean gas supplied from the gas supply section 610 is directly supplied into the second chamber 414, and is supplied to the first chamber 413 through a temperature regulator 611.

Temperature regulation in the aligner 200 needs more accuracy as compared with that in the developing unit (DEV). Therefore, as described above, by supplying the clean gas which is more accurately regulated in temperature by the temperature regulator 611 to the first chamber 413 in which the wafer W before exposure is housed, the exposing processing in the aligner 200 can be more accurately performed in a shorter time.

Figure 16:
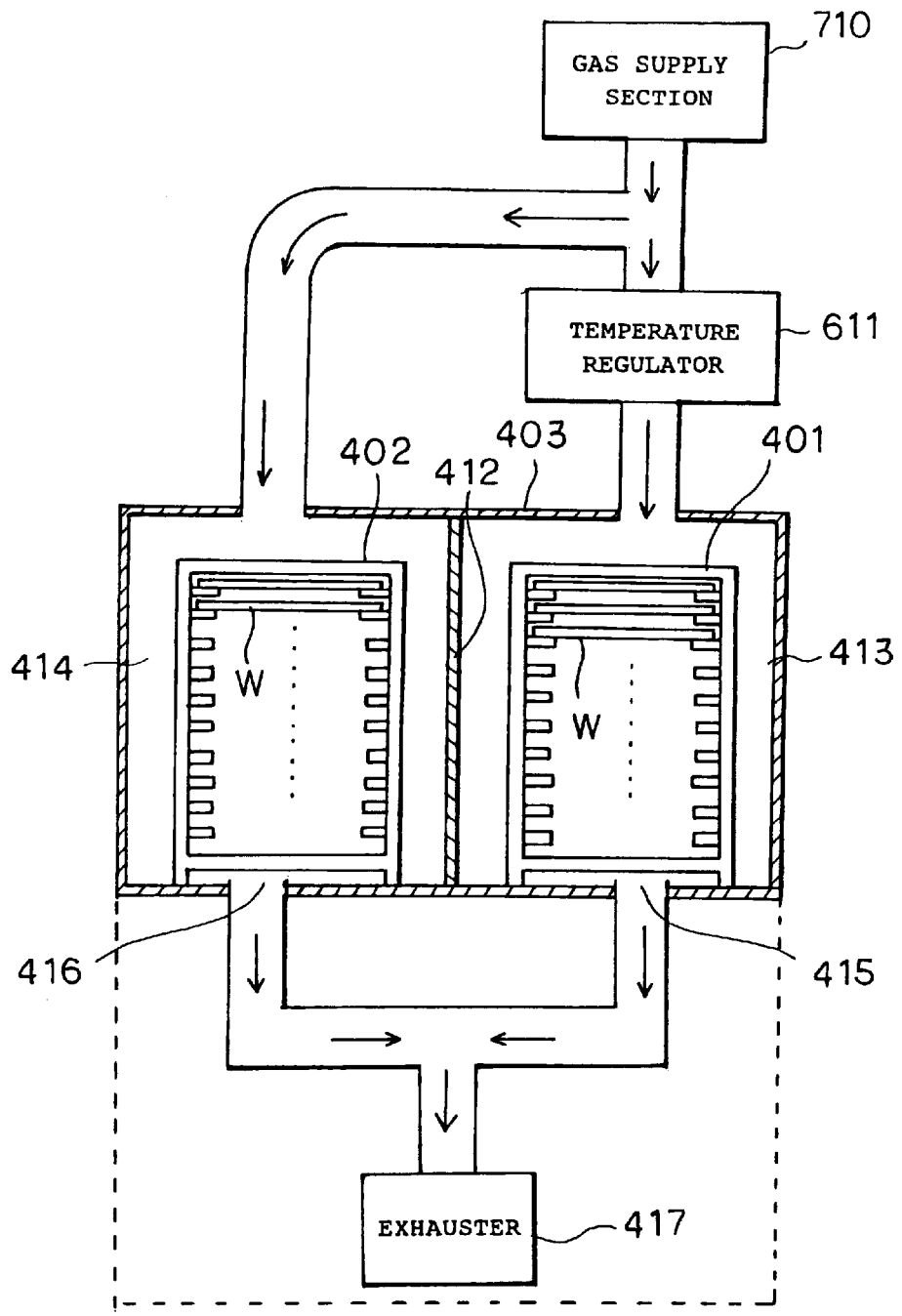
FIG. 16 is a side view of the stage according to the modification of the embodiment shown in FIG. 15.

In this embodiment, the gas supply section 610 supplies the temperature regulated gas (air) to the aligner 200, but a gas supply section 710 as shown in FIG. 16 may supply the temperature regulated clean gas only to the first and second chambers 413 and 414.

Next, still one more another embodiment will be described.

Figure 17:
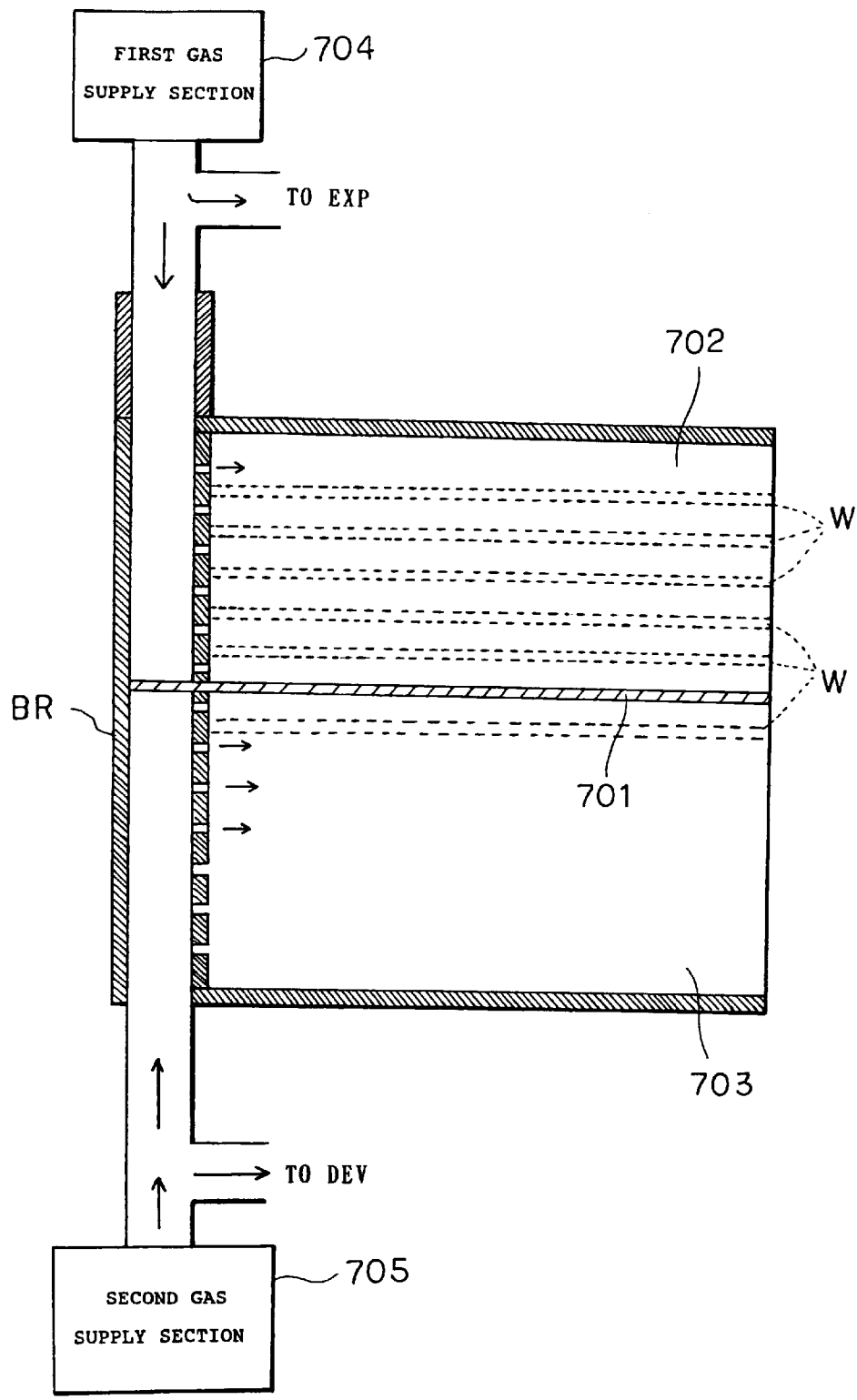
FIG. 17 is an explanatory view of a buffer cassette according to the still one more another embodiment of the present invention.

FIG. 17 is an explanatory view of a buffer cassette BR according to this embodiment.

As shown in FIG. 17, the inside of the buffer cassette BR is divided into an upper tier chamber 702 and a lower tier chamber 703 by a partition 701. In the upper tier chamber 702, the wafer W to be delivered to the aligner 200 is housed. In the lower tier chamber 703, the wafer W delivered from the aligner 200 is housed.

The temperature regulated clean gas is supplied from a first gas supply section 704 for supplying the temperature regulated clean gas (air) to the aligner 200, to the upper tier chamber 702. The temperature regulated clean gas is supplied from a second gas supply section 705 for supplying the temperature regulated clean gas (air) to the developing unit (DEV), to the lower tier chamber 703.

In this embodiment, the exposing processing in the aligner 200 can be more accurately performed in a shorter time, and the developing processing in the developing unit (DEV) can be more accurately performed in a shorter time. It is noted that the art according to the embodiment shown in FIG. 14 to FIG. 16 can be similarly applied to the buffer cassette.

Figure 18:
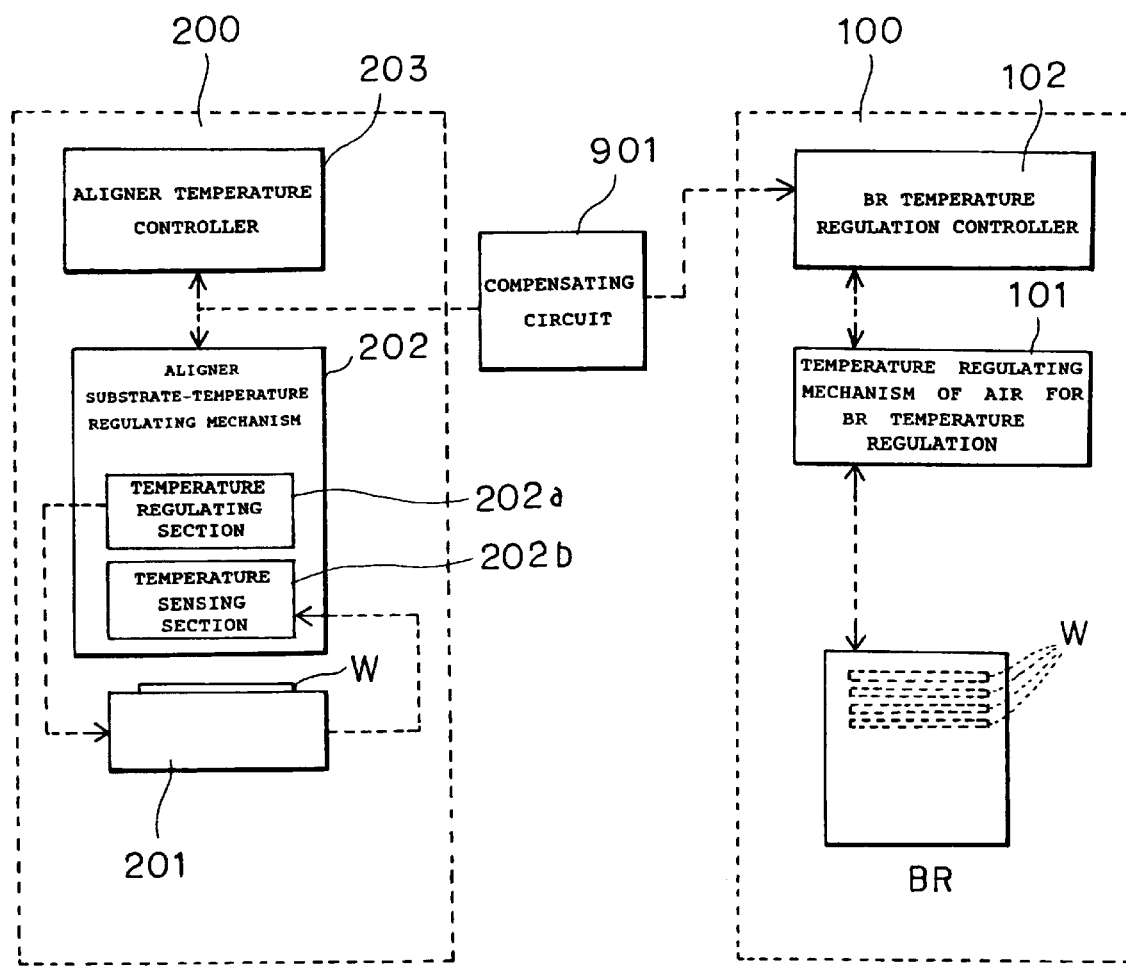
FIG. 18 is an explanatory view of a modification of the embodiment shown in FIG. 5.

Incidentally, in the embodiment shown in FIG. 5, the sensed signal on the aligner 200 side is directly sent to the coating and developing system 100 side. It is also suitable that the sensed signal is sent via a compensating circuit 901 for compensating the sensed signal on the aligner 200 side, to the coating and developing system 100 side as shown in FIG. 18. The compensating circuit 901 is what compensates in such a manner as to adjust the sensed signal on the aligner 200 side to temperature regulation on the coating and developing system 100 side.

The compensating circuit is provided as above, thereby enabling to realize the art according to the present invention on the coating and developing unit 100 side even in an aligner having a conventional configuration.

Figure 19:
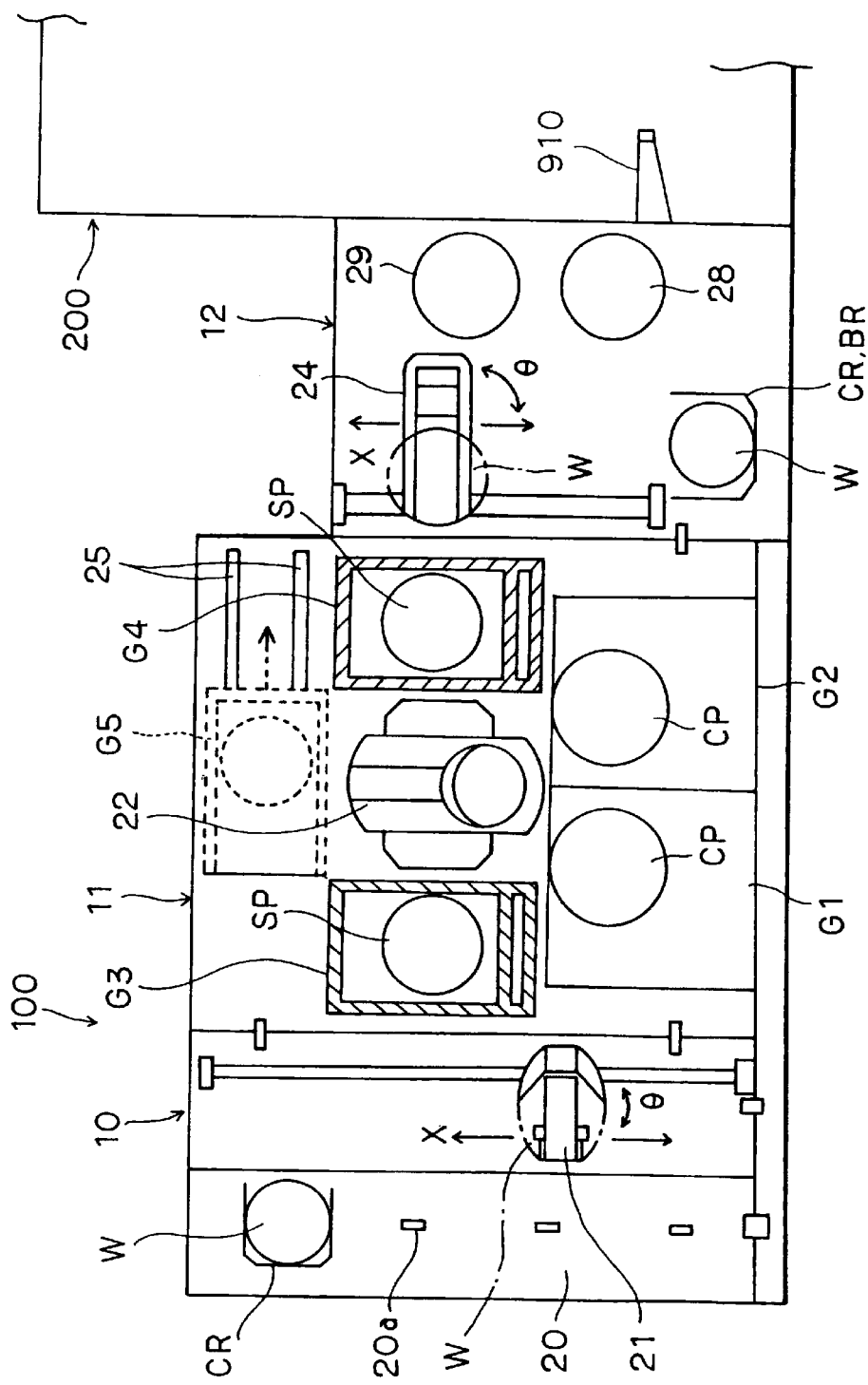
FIG. 19 is an explanatory view of further still another modification.

If a sensed signal is not outputted from the aligner 200 side, for example, a temperature sensing mechanism 910 projecting toward the aligner 200 may be provided on the aligner 200 side of the coating and developing unit 100 as shown in FIG. 19. For example, a temperature sensing section is provided at the tip of the temperature sensing mechanism 910, when the coating and developing system 100 and the aligner 200 are linked together, the temperature sensing mechanism 910 can measure the temperature inside the aligner 200. Then temperature regulation for cassette buffers and stages is performed on the basis of the results sensed by the temperature sensing mechanism 910.

Moreover, in the present invention, the substrate is not limited to the wafer, any substrate to which photolithography technology can be applied may be also employed, for example, a glass substrate for a liquid crystal display may be used.

The aforesaid embodiments have the intention of clarifying technical meaning of the present invention. Therefore, the present invention is not intended to be limited to the above concrete embodiments or to be interpreted in a narrow detect, and various changes may be made therein without departing from the spirit of the present invention and within the meaning of the claims.

The Japanese patent application Nos. 10-197627 filed Jul. 13, 1998 and 10-306302 filed Oct. 13, 1998 are hereby incorporated by reference including the entire specifications and all drawings.

What is claimed is:

1. A substrate processing apparatus connected to an aligner for exposing a substrate coated with a resist, while regulating the temperature of the substrate, the substrate processing apparatus comprising:

a coating section that applies a resist to the substrate;

a developing section that develops the substrate after exposure;

an interface section disposed between said coating section and said developing section, and said aligner, that transfers a substrate between said substrate processing apparatus and said aligner;

a conveyor that transfers a substrate between said coating section, said developing section and said interface section;

a holding section disposed in said interface section, that holds the substrate; and a temperature controller that regulates the temperature of the substrate held by said holding section in accordance with a regulated temperature in said aligner.

2. The apparatus as set forth in claim 1, wherein said aligner includes a temperature sensing section that senses the temperature when a substrate is exposed, and for outputting a signal in correspondence to the sensed temperature; and wherein said temperature controller regulates the temperature of the substrate held by said holding section in response to the signal outputted from said temperature sensing section.

3. The apparatus as set forth in claim 2, including a means for compensating the signal outputted from said temperature sensing section to fit to the temperature regulation by said temperature controller, wherein said temperature controller regulates the temperature of the substrate held by said holding section in response to the compensated signal.

4. The apparatus as set forth claim 1, said apparatus including a temperature sensing section that senses the temperature when a substrate is exposed in said aligner, and outputs a signal in correspondence to the sensed result, wherein said temperature controller regulates the temperature of the substrate held by said holding section in response to the signal outputted from said temperature sensing section.

5. The apparatus as set forth in claim 1,
said holding section including a buffer cassette which can hold a plurality of said substrates.

6. The apparatus as set forth in claim 5,
wherein said buffer cassette is configured to hold a plurality of the substrate nearly parallel to each other, and
wherein said temperature controller releases temperature regulated gas between the substrates held in said buffer cassette.

7. The apparatus as set forth in claim 1,
wherein said holding section includes a stage disposed at a position where said substrate is delivered to/from said aligner, and can mount thereon the substrate.

8. The apparatus as set forth in claim 7, said temperature controller including a means for regulating the temperature of said stage.

9. The apparatus as set forth in claim 1,
wherein said aligner regulates the temperature of the substrate coated with a resist by supplying temperature regulated gas, and
wherein said temperature controller supplies the temperature regulated gas to said holding section by supplying the temperature regulated gas, which is supplied to said aligner, to said interface section.

10. The apparatus as set forth in claim 3,
wherein said aligner regulates the temperature of the substrate coated with a resist by supplying the temperature regulated gas, and
wherein said temperature controller directly supplies the temperature regulated gas, which is supplied to said aligner, to said buffer cassette.

11. The apparatus as set forth in claim 3, said apparatus further comprising a means for supplying the temperature regulated gas to said developing section,
wherein said aligner regulates the temperature of the substrate coated with a resist by supplying the temperature regulated gas,
wherein said buffer cassette includes a first chamber that houses the substrate before being exposed and second chamber that houses the substrate after being exposed, and
wherein said temperature controller supplies the temperature regulated gas, which is supplied to said aligner, to said first chamber, and supplies the temperature regulated gas, which is supplied to said developing section, to said second chamber.

12. The processing system as set forth in claim 7,
wherein said stage includes a first mounting section on which the substrate before being exposed is mounted, and a second mounting section on which the substrate after being exposed is mounted.

13. The apparatus as set forth in claim 12, said apparatus further comprising a means for supplying the temperature regulated gas to said developing section,
wherein said aligner regulates the temperature of the substrate coated with a resist by supplying the temperature regulated gas, and
wherein said temperature controller supplies the temperature regulated gas, which is supplied to said aligner, to said first mounting section, and supplies the temperature regulated gas, which is supplied to said developing section, to said second mounting section.

14. The apparatus as set forth in claim 12,
wherein said first mounting section and said second mounting section respectively comprise:
a housing section that houses substrates in a plurality of tiers thereof; and
a cover member that covers said housing section, and provided with a first opening section which enables access to each substrate housed in a plurality of tiers in said housing section from said interface section, and a second opening section which enables access to each substrate housed in a plurality of tiers in said housing section from said aligner.

15. The apparatus as set forth in claim 14, further comprising:
a first door arranged to open and close to said first opening section;
a first opening and closing mechanism that opens and closes said first door;
a second door arranged to open and close to said second opening section; and
a second opening and closing mechanism that opens and closes said second door.

16. The apparatus as set forth in claim 14, further comprising an exhaust that exhausts a space covered with said cover member.

17. The apparatus as set forth in claim 12,
wherein said first mounting section and said second mounting section respectively comprise:
a housing section that houses substrates in a plurality of tiers;
a cover member that covers said housing section, and provided with a first opening section which enables access to at least one of the substrates housed in the plurality of tiers in said housing section from said interface section, and a second opening section which enables access to at least one of the substrates housed in the plurality of tiers in said housing section from said aligner; and
an elevator that ascends and descends said housing section.

18. A substrate processing apparatus connected to an aligner for exposing a substrate coated with a resist, while regulating the temperature of the substrate, the substrate processing apparatus comprising:
a coating section that applies a resist to the substrate;
a developing section that develops the substrate after exposure;
an interface section disposed between said coating section and said developing section, and said aligner, that transfers a substrate between said substrate processing apparatus and said aligner;
a conveyor that transfers a substrate between said coating section, said developing section and said interface section;
a first holding section disposed in said interface section that holds the substrate before being exposed;
a second holding section disposed in said interface section that holds the substrate after being exposed;
a gas supply section that supplies temperature regulated gas to said first and second holding sections; and
a temperature controller between said first holding section and said gas supply section, that further regulates the temperature of the gas supplied from said gas supply section.

19. The apparatus as set forth in claim 18,
wherein said aligner regulates the temperature of the substrate coated with a resist by supplying the temperature regulated gas, and wherein said gas supply section supplies the gas, which is supplied to said aligner, to said first and second holding sections as the temperature regulated gas.

20. A substrate processing apparatus, comprising:

an aligner that exposes a substrate coated with a resist, while regulating the temperature of the substrate;

a coating section that applies a resist to the substrate;

a developing section that develops the substrate after exposure;

an interface section disposed between said coating section and said developing section, and said aligner, that transfers a substrate between said substrate processing apparatus and said aligner;

a conveyor that transfers a substrate between said coating section, said developing section and said interface section;

a holding section disposed in said interface section, that holds the substrate; and a temperature controller that regulates the temperature of the substrate held by said holding section in accordance with a regulated temperature in said aligner.

* * * * *